United States Patent [19]
Beausang et al.

[11] Patent Number: 6,106,568
[45] Date of Patent: *Aug. 22, 2000

[54] HIERARCHICAL SCAN ARCHITECTURE FOR DESIGN FOR TEST APPLICATIONS

[75] Inventors: James Beausang; Chris Ellingham, both of Mountain View; Markus F. Robinson, Berkeley, all of Calif.; Robert Walker, Boulder, Colo.

[73] Assignee: Synopsys, Inc., Mountain View, Calif.

[ * ] Notice: This patent is subject to a terminal disclaimer.

[21] Appl. No.: 09/324,755

[22] Filed: Jun. 3, 1999

Related U.S. Application Data

[63] Continuation of application No. 08/704,129, Aug. 28, 1996.

[51] Int. Cl.[7] .................................................... G06F 17/50
[52] U.S. Cl. .................................... 716/18; 716/2; 716/17
[58] Field of Search .......................... 395/500.02–500.19; 716/1–21

[56] References Cited

U.S. PATENT DOCUMENTS

| | | | |
|---|---|---|---|
| 5,522,063 | 5/1996 | Ashar et al. | 716/4 |
| 5,696,771 | 12/1997 | Beausang et al. | 714/726 |
| 5,703,789 | 12/1997 | Beausang et al. | 716/4 |
| 5,831,868 | 11/1998 | Beausang et al. | 716/18 |
| 5,903,466 | 5/1999 | Beausang et al. | 716/18 |
| 5,949,692 | 9/1999 | Beausang et al. | 716/18 |

OTHER PUBLICATIONS

Barbagallo et al. ("Scan insertion criteria for low design impact", Proceedings of the 14th VLSI Test Symposium, Apr. 28, 1996, pp. 26–31).

Cox, ("On synthesizing circuits with implicit testability constraints", Proceedings of the International Test Conference, Oct. 2, 1994, pp. 989–998).

*Primary Examiner*—Paul R. Lintz
*Assistant Examiner*—Phallaka Kik
*Attorney, Agent, or Firm*—Wagner, Murabito & Hao LLP

[57] ABSTRACT

A system and method for architecting design for test circuitry (e.g., scan architecting) within an integrated circuit design having subdesigns (e.g., modules). The novel system contains a default operational mode (no user specification) and an operational mode based on user specifications; within either mode, the system recognizes and allows definition of subdesign scan chains which can be linked together alone or with other scan elements to architect complex scan chains (e.g., top level scan chains). The system includes specification, analysis, synthesis and reporting processes which can be used in an IC design having a hierarchical structure including modules. The specification process accesses a design database and a script file and allows a user to define global scan properties (scan style, number of chains, etc.), properties of a particular scan chain (membership, name, etc.), test signals (scan-in, scan-out, scan-enable, etc.), complex elements used as part of a scan chain without requiring scan replacement, wires and latches forming connections between scan elements; this information is associated with the selected design database. Analysis reads the design database and performs architecting of scan chains based on inferred scan elements of the design and defined (e.g. specified) scan elements. During analysis, the logic within the design database is not altered and a script is generated for user modification/verification. Specification and analysis can be executed iteratively until the desired scan structures are planned. Synthesis then implements the desired DFT circuitry by altering the design database based on the scan chains planned by analysis.

20 Claims, 23 Drawing Sheets

250B

HIERARCHICAL SCAN ARCHITECTURE FOR DESIGN FOR TEST APPLICATIONS

This is a continuation of copending application(s) Ser. No. 08/704,129 filed on Aug. 28, 1996.

BACKGROUND OF THE INVENTION

(1) Field of the Invention

The present invention relates to the field of computer aided design (CAD) systems for integrated circuit (IC) designs. Specifically, the present invention relates to the field of CAD systems for implementation of design for test (DFT) circuitry.

(2) Prior Art

Complex integrated circuits (ICs) are designed with the use of computer aided design (CAD) tools. Specifically, application specific integrated circuits (ASICs) and field programmable gate array (FPGA) circuits are designed using a variety of CAD tools. The development of IC custom designs (e.g., ASICs and FPGA circuits) with the aid of CAD tools is referred to as electronic design automation or EDA. Design, checking and testing of large scale integrated circuits are so complex that the use of programmed computer systems are required for realization of normal IC designs. This is partly because the integrated devices are inherently complex and partly because an IC design can be decomposed into simpler functions and units which can be effectively processed by a computer system. CAD systems are also used in IC designs because considerable computation is required in order to achieve an efficient substrate layout (e.g., placement) of the resultant IC design. The result of the computerized design process is a detailed specification defining a complex integrated circuit in terms of a particular technology. This specification can be regarded as a template for the fabrication of the physical embodiment of the integrated circuit using transistors, routing resources, etc.

As part of the CAD system for fabricating ICs, design for test (DFT) circuitry and techniques are utilized to integrate circuit elements into an IC design which allow for circuit testability. Generally, DFT circuitry can require the replacement of certain cells in an IC design with specialized cells that allow for the application of test vectors (bit strings) to circuitry within the IC design (e.g., "circuit stimulus"). Furthermore, the DFT circuitry also captures the output of the IC circuitry in response to the circuit stimulus and reports this output for comparison against a stored reference output. In one particular DFT methodology, sequential cells are used to shift serial test vectors into the IC design, apply the test vectors to the IC circuitry, capture the circuitry's output and then serially shift the output data for comparison. In this methodology, the DFT cells that serially shift in the test vectors are referred to as scan cells and they are linked together to form scan chains. a single scan chain receives input test vector data and supplies the response data. A single IC design can contain multiple scan chains.

An IC design can contain many subdesigns (modules) which likewise can contain subdesigns therein. Under this topology, the top level of an IC design typically includes a hierarchical structure of interconnected circuit modules. Furthermore, the various modules of an IC design are typically assigned to and developed by different groups of people working under common direction from top level designers and architects. It is desirable to apply DFT circuitry throughout a hierarchical IC design. Therefore it is desirable to apply DFT circuitry to the top level of the IC design and also to any modules (subdesigns) located therein so that the entire IC design can be properly tested. Since different modules of an IC design can be independently developed, it would be desirable to allow independent development and insertion of DFT circuitry for individual modules.

Unfortunately, within prior art CAD systems that automatically construct DFT circuitry, their scan architecture processes generally recognize: 1) scan cells; and 2) complete scan chains that commence at a primary input and end at a primary output of the "chip." Therefore, in constructing a complete scan chain by integrating modules designs, any DFT routing circuitry already present within a module is eliminated by prior art CAD systems and scan paths within the module are then reconstructed using heuristics pertinent to the CAD system and using configurations defined at the top level design. This prior art approach is inefficient in that DFT circuitry located within modules is removed and re-architected instead of directly integrated in larger scan chains. This approach is also inefficient in that same DFT circuitry located in replicated modules is not re-used by the prior art CAD systems.

The above prior art approach is also problematic because it does not allow DFT implementation to be spread among many module designers. It is desirable to allow module designers to implement subdesign scan chains so that the process of adding DFT circuitry can be spread among many designs. By spreading the DFT implementation across modules, the overall time required to generate the integrated DFT implementation in a hierarchical design can be decreased and efficiency increased. Also, by allowing a subdesigner to implement subdesign scan chains which are later used during integration, certain risks associated with DFT integration (e.g., not finding scan design rule violations earlier in the design flow) can be reduced allowing the DFT integration to flow more smoothly with less unexpected problems. Furthermore, since module designers are capable of optimizing their designs, it is desirable not to remove and redesign subdesign scan chains within existing modules because these modifications can risk creating constraint violations within the modified modules. In effect, the act of removing the scan chains and adding new scan structure to an existing module, as done in the prior art, can violate specified constraints that are otherwise satisfied by the original optimized module design.

It is appreciated that some prior art CAD systems allow existing DFT circuitry of a module to be manually presented and used by the top level DFT design. Although this method provides some ability for the module designers to provide DFT information for the top level DFT processes, the requirement that this information be manually entered and maintained is economically expensive for almost all IC designs.

Also, in certain DFT implementations, the time required to perform scan insertion is relatively long. It is desired to provide a mechanism and system allowing a user to observe certain results of the scan insertion, for purposes of DFT designing, without requiring the full scan insertion duration or making actual design modifications.

Accordingly, what is needed is a CAD system and mechanism for effectively allowing top level DFT processes to automatically integrate DFT designs located within modules in order to architect top level scan chains. Further, what is needed is a CAD system and mechanism as above for allowing automatic construction of scan chains within modules when none currently exist. What is further needed is a mechanism and system allowing a user to observe certain results of the scan insertion, for purposes of DFT designing, without requiring the full scan insertion duration. Also, what is needed is a system for allowing user specifications for controlling the above processes. The present invention provides these advantageous functionalities. Under the present invention, a designer of a module within an IC design can independently generate a subdesign scan chain that can be later used by the DFT processing of the top level. Therefore, under the present invention, the module designer can effectively "sign off" his or her work at the completion of the module design and their completed and optimized modules do not need to be later disrupted, and possibly risk constraint violations, during DFT processes of the top level.

SUMMARY OF THE INVENTION

A system and method are described for architecting design for test circuitry (e.g., scan architecting) within an integrated circuit design having subdesigns (e.g., modules). The present invention system contains a default operational mode (no user specification) and an operational mode based on user specifications; within either mode, the system recognizes and allows definition of subdesign scan chains which can be linked together alone or with other scan elements to architect complex scan chains (e.g., top level scan chains). The system includes specification, analysis, synthesis and reporting processes which can be used in an IC design having a hierarchical structure including modules. The specification process accesses a design database and a script file (or accesses command-line instructions) and allows a user to define global scan properties (scan style, number of chains, etc.), properties of a particular scan chain (membership, name, etc.), test signals (scan-in, scan-out, scan-enable, etc.), complex elements used as part of a scan chain without requiring scan replacement, wires and latches forming connections between scan elements; this information is associated with the selected design database. The analysis processes reads the design database and performs architecting of scan chains based on inferred scan elements of the design and defined (e.g. specified) scan elements. During analysis, the logic within the design database is not altered and an output script and or report is generated. The script (or report) generated by analysis indicates scan structures that "will be," but do not currently exist. Specification and analysis can be executed iteratively until a desired report is generated. The synthesis process then alters the design database based on a final scan chain specification to implement the desired DFT circuitry. At any time, the report processes generates a report of the existing scan structures within a design database (e.g., "what is") without altering the design. By not requiring synthesis to be executed until after the scan structures are approved during specification-analysis iterations, repetition of the time consuming synthesis process is avoided within the present invention.

Specifically, embodiments of the present invention include a method of inserting scan resources into a integrated circuit design organized into hierarchical modules, the method comprising the steps of: a) receiving user originated specification commands from the user or from a script file, the specification commands defining scan configurations indicating a manner in which scan chains are to be constructed and defining scan structures to be constructed within the scan chains; b) annotating the design with the specification commands; c) analyzing the specification commands and the design to generate a scan plan based on the design and based on the specification commands without altering logic within the design, the step c) further comprising the steps of: 1) partially constructing scan chains within the scan plan according to the specification commands; 2) identifying scan structure within the design not covered by the specification commands; 3) completely constructing the scan chains within the scan plan based on the scan structure identified above in an effort to generate balanced scan chains; d) synthesizing the scan plan within the design by inserting scan resources into the design to realize the balanced scan chains of the scan plan.

DETAILED DESCRIPTION OF THE INVENTION

A system and method for providing design for test circuitry within a integrated circuit (IC) design that can include hierarchical structured subdesigns. In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

NOTATION AND NOMENCLATURE

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, program, etc., is here, and generally, conceived to be a self-consistent sequence of steps or instructions leading to a desired result. The steps are those requiring physical manipulations of physical quantities. These physical quantities represent actual, physical, artifacts. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities they represent and are merely convenient labels applied to these quantities. Unless specifically stated otherwise as apparent from the following discussions, throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. The physical quantities are themselves representative of actual, physical, artifacts. For instance, within the present invention the physical quantities are representative of logic gates and connections fabricated on a semiconductor substrate to realize an integrated circuit.

COMPUTER AIDED DESIGN (CAD) COMPUTER SYSTEM

Figure 15:
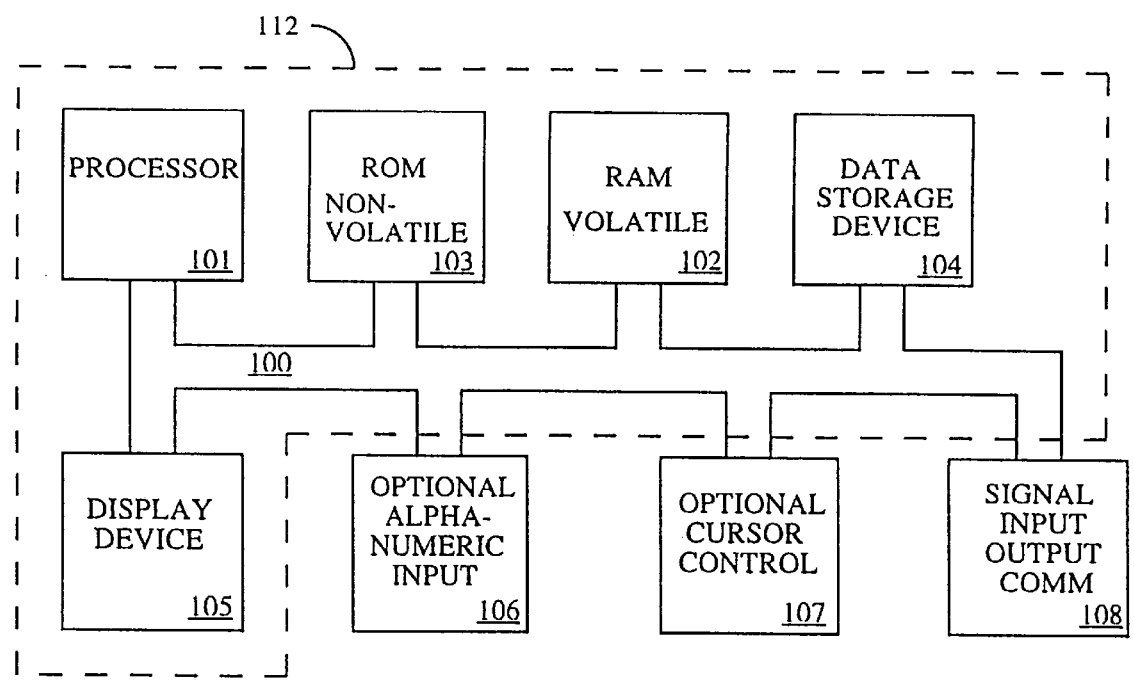
FIG. 15 is a block diagram of a computer aided design (CAD) system implementing the scan processes of the present invention.

Refer to FIG. 15 which illustrates a computer aided design (CAD) system 112 implemented to execute processes of the present invention. In general, computer system 112 used by the preferred embodiment of the present invention comprise an address/data bus 100 for communicating address and data information, one or more central processors 101 coupled with the bus 100 for processing information and instructions, a computer readable volatile memory unit (e.g., random access memory, flash memory, etc.) 102 coupled with the bus 100 for storing information (e.g., design database information) and instructions for the central processor 101, a computer readable non-volatile memory unit (e.g., a read only memory) 103 coupled with the bus 100 for storing static information and instructions for the processor 101, a computer readable data storage device 104 such as a magnetic or optical disk and disk drive coupled with the bus 100 for storing information and instructions, and a display device 105 coupled to the bus 100 for displaying information to the computer user. Optionally, computer system 112 can also include an alphanumeric input device 106 (e.g., keyboard) including alphanumeric and function keys coupled to the bus 100 for communicating information and command selections to the central processor 101, a cursor control device 107 (e.g., mouse, trackpad, pen and pad, trackball, etc.) coupled to the bus for communicating user input information and command selections to the central processor 101, and a signal generating device 108 coupled to the bus 100 for communicating command selections to the processor 101.

It is appreciated that the processes of the present invention to be described below (e.g., the processes of check test 220, specification 230, reporting 240, analysis 250, and synthesis 260) are implemented, in one embodiment of the present invention, as program code or instructions stored within the above referenced computer readable memory units. Upon execution of this code (or instructions) by the processor, the above described processes cause computer system 112 to perform in the manner indicated below.

HIERARCHICAL SCAN SYSTEM OF THE PRESENT INVENTION

I. Scan Test System 205

Figure 1A:
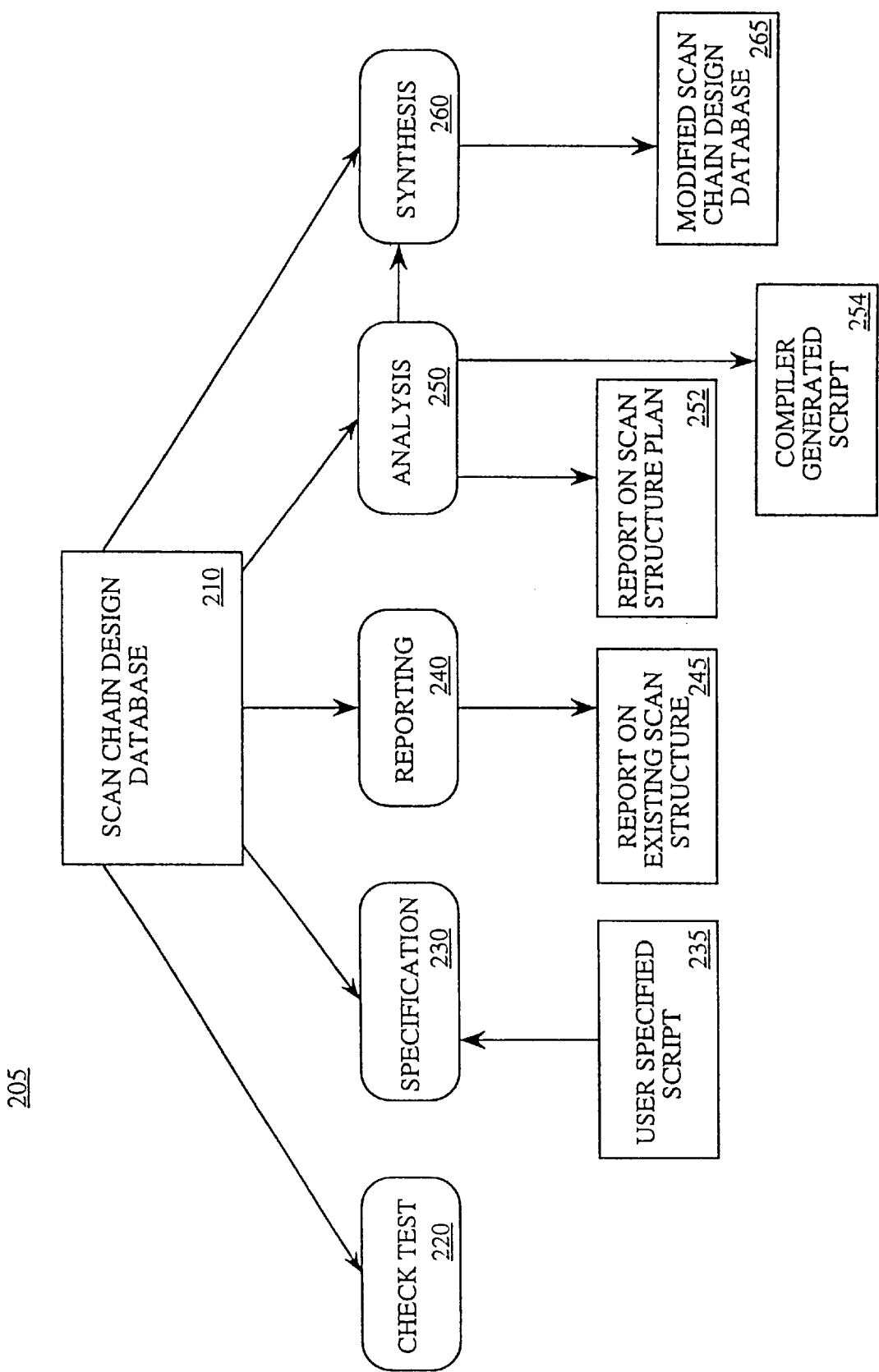
FIG. 1A is a data flow diagram illustrating the check test, specification, reporting, analysis and synthesis processes of the hierarchical scan system of the present invention.

DATA INTERFACE. FIG. 1A illustrates the components of the scan test system 205 ("system 205") of the present invention. Five processes are shown: check test 220, specification 230, reporting 240, analysis 250, and synthesis 260 processes. Each of the above processes interact with a scan chain design database 210 ("database 210") as shown in FIG. 1A. Database 210 defines a hierarchical structured integrated circuit (IC) design having cells organized with a top level and one or more design modules defined therein (e.g., see FIG. 11A with top level 740 and "child" modules 742, 744, and 746). The database 210 is a netlist of logic cells and either contains or is specified to contain scan structure (e.g., scan cells, scan segments, hierarchical cells, functional shift segments, etc.). Individual modules within database 210 1) can contain no scan structure at all, 2) can contain scan replaced sequential cells but not routed sequential cells, 3) can contain fully scan replaced and routed sequential cells, 4) can contain fully scan replaced sequential cells with loopback connections, or 5) can contain any mixture of the above. The same is true for sequential cells located within database 210's top level but not located within any module. It is appreciated that the above five processes can be made applicable to, or limited only to, any subdesign (e.g., module) within database 210 by specifically naming the desired module as the "current design" (e.g., using a current_design=command) This facilitates bottom up scan structure architecting as described further below.

The present invention system 205 provides a vehicle for automatic architecting of complete scan chains (e.g., primary input to primary output) within the IC design represented by database 210 and, during this process, allows a user to define and utilize specialized scan structures (e.g., a user defined scan segment) which can represent a subdesign (e.g., module) scan chain or other sequential structure, like a shift register. In effect, the scan segments can be integrated with other scan structures (e.g., using the set_scan_path command) to construct complete scan chains. Those portions of a scan chain not specifically identified by the user can be automatically supplemented by system 205 according to certain default behaviors.

The present invention system 205 also identifies certain inferred scan structures (e.g., inferred scan segment) that exist within a module that was either created by constraint driven scan insertion processes used by the present invention or that was processed through check test process 220 of the present invention (a design rule checker). By providing the above operations, the present invention system 205 allows the insertion of scan structure within a hierarchical IC design. To this extent, scan structures that exist within modules of the IC design can be used in the creation of complete scan chains, rather than being destroyed and rerouted during creation of the complete scan chain (as done in the past). As discussed in detail below, a number of different specification commands are supported for the above.

According to system 205, a check test process 220 is implemented to read the contents of database 210 in order to perform specific well known design rule checking processes. With respect to the design rule checking processes, process 220 identifies existing scan structure within database 210 and analyzes any existing scan chains for scan rule violations via symbolic simulation (e.g., token dropping and monitoring). Process 220 flags valid sequential cells for replacement. Any sequential cells that are part of a violated scan chain are marked as violated by the check test process 220 and a report can be generated indicative thereof. One implementation of a check test process 220 is described with respect to a reference entitled A Simulation-Based Protocol-Driven Scan Test Design Rule Checker, by E. B. Petty, D. Martin, and H. T. Ma, International Test Conference, Paper 40.2, page 999 et seq. (1994). It is appreciated that according to the present invention, check test process 220 also performs annotation of any existing valid scan structure that it encounters during its normal functioning. The annotation is performed by generating a data structure within the database 210 and specially marking the data structure to represent the identified scan structure. Alternatively, the identified scan structure within database 210 can also be directly marked. This annotation of existing scan structure allows the analysis 250 process of the present invention (and thereby the synthesis 260 process) to automatically identify inferred scan structure within database 210 by its corresponding annotations. It is appreciated that any design netlists run through or generated by certain existing scan insertion processes (e.g., the constraint driven scan insertion process, as described in U.S. patent application Ser. No. 08/581,187 filed Dec. 29, 1995, entitled Test Ready Compiler for Design for Test Synthesis U.S. Pat. No. 5,703,789) also contains analogous annotation of its scan structure. Therefore, the present invention system 205 recognizes inferred scan structure annotated within database 210 and this annotation can originate from a design processed through check test 220 or from output of certain existing scan insertion processes (e.g., the above constraint driven scan insertion process). Check test process 220 is typically invoked in advance of analysis process 250 and also after synthesis process 260.

Specification Process 230. The specification process 230 of FIG. 1A allows a user to describe the manner in which system 205 is to configure scan chains. The specification process 230 of the present invention accepts two types of inputs, one is database 210 and the other is a user specified script 235 ("script 235"). Script 235 contains lists of specific user defined commands (e.g., in a format: set_scan_) that define certain user specified scan structures that system 205 constructs and also certain configuration information. These commands can be individually applied directly to system 230 (using a shell) or collectively using a script file 235. Script 235 typically comprises a partial user defined specification of the resultant scan structure. The complete scan structures architected by system 205 typically include the user specified structures of script 235 in addition to other structures constructed by certain default behaviors of the analysis 250 and synthesis 260 processes.

Under one embodiment of the present invention, the specification process 230 queries database 210 for existing specifications and performs specification consistency checks based on the input user specification commands (defined further below). Types of permitted user specifications include: (1) identification of scan objects, e.g., scan cells, scan segments, scan chains, scan access pins, scan ports, scan signals, scan links, and scan designs, and the attribution of scan objects through specification of scan methodology, scan style and scan signal types; and (2) specification of the relationships between objects, e.g., that a port is the scan input signal to a particular chain. After the consistency checks are complete, process 230 annotates database 210 with a validated form of the consistent user defined commands which indicate the subject matter of the specification commands received by process 230. Although database 210 is annotated, it is not otherwise altered, e.g., process 230 does not cause any logic to be created or any scan routing to be inserted in database 210. System 205 allows iteration within the specification process 230 as long as the sequence of specifications applied to the database 210 are self consistent. Validation ensures that the specifications are consistent.

According to commands processed by the specification process 230, system 205 allows as little or as much scan detail to be specified as desired by the user. If no user specifications are given to process 230, system 205 follows a default behavior in constructing scan structure within database 210. To the extent user commands define a particular scan structure explicitly, system 205 assigns the specified cells to the scan structure. Any partial specification defined within the script 235 is completed using default behavior of system 205. Since the IC designs within 210 are generally hierarchical, process 230 allows both bottom-up and top-down scan insertion. The specification process 230 is additionally described below in relation to an exemplary set of user commands processed therein.

Reporting Process 240. The reporting process 240 of the present invention 205 as shown in FIG. 1A receives its input from the database 210 and generates a user readable output report file 245 that indicates the state of any scan structure that presently exists within the specified "current design" of the database 210. This report is stored in a "report on existing scan structure" file 245 ("report or file 245"). Typically report 245 indicates the elements of particular scan structure (e.g., cells, ports) that form a scan chain. Report 245 indicates "what is" stored in database 210, e.g., it indicates the structure of scan chains that currently exist in database 210 but process 240 does not alter the database 210. Scan structure is created within database 210 by making the connections manually, using certain existing scan insertion tools, or by synthesis process 260 (which includes constraint driven scan insertions processes). Process 240 can be invoked at any stage in the specification 230, analysis 250, and synthesis 260 processes of system 205. Reporting process 240 is invoked via a user command (e.g., report_test).

It is appreciated that reporting process 240 can be limited to a particular subdesign (e.g., module) of the IC design within 210 by specifying a module as the current design. The current design can also be specified as the top level design. An exemplary command set for report process 240 is presented further below. An example report 245 (-scan_path) is shown below, see FIG. 6B:

```
Report: test
-scan_path
Design: P
Version: Vx
Date: current date
    (*) indicates change of polarity in scan data
    (c) indicates cell is scan controllable only
    (o) indicates cell is scan observable only
    (x) indicates cell cannot capture
    Complete scan chaip #1 (test_si_1 --> test_so_1) contains 3 cells:
        test_si_1          -->
        childA/1           -->
        childA/2           -->
        childB/1           -->
        test_so_1
    Complete Scan chain #2 (test_si_2 --> test_so_2) contains 3 cells:
        test_si_2          -->
        childB/2           -->
        childB/3           -->
        childB/4           -->
        test_so_2
```

Analysis Process 250. The analysis process 250 of FIG. 1A inputs database 210 containing any annotations inserted by specification process 230 and also any annotations placed therein by check test process 220 or from the constraint driven scan insertion processes. Analysis process 250 is invoked by a user command (e.g., preview_scan), and produces a complete scan chain design plan (scan plan) that satisfies scan specifications in database 210, reports on the scan chain design plan to the user without actually implementing the scan structure, and checks for specification consistencies. In one embodiment, analysis process 250 does not annotate database 210 nor does analysis process 250 alter the logic within database 210. If script 235 defines only a partial specification of the scan structure, analysis process 250 generates a complete scan structure based on default behaviors described further below. Synthesis process 260 utilizes analysis process 250, therefore they generate the same complete scan structure plan, including the number of scan chains to be implemented, the design ports to be used for the scan ports, and the manner in which sequential cells are to be ordered on the scan chains. Specifically, analysis process 250 constructs and balances scan chains within the current design depending on user specification and default behavior.

Assuming no inconsistencies are detected in the specifications in database 210, analysis process 250 generates two types of reports which describe the scan plan: 1) a "report on scan structure plan" file 252; and 2) a compiler generated script file 254, depending on user commands. If inconsistencies are detected, the process 250 reports them and files 252 and 254 are either not generated or are complete with inconsistent information discarded. Processes within analysis process 250 are described with respect to FIGS. 2A, 2B, 2C, 2D, 3A, 3B, 4A and 4B.

File 252 is a user readable persistent report of the scan configuration that would be produced if synthesis process 260 were invoked and includes detail regarding the scan structures (e.g., scan segments, scan links, scan ports, scan cells, etc.) within a scan chain. Unlike report 245, the report 252 of the analysis process 250 is a report on scan structure plan in that it reports on scan structure that "is to be" but is not yet architected by the synthesis process 260. Also, report 252 can be customized to display information of particular use to the user. The use of rapid analysis process 250 is advantageous because a user can receive an indication of a scan structure by report 252 without actually being required to architect the structure using synthesis process 260 (a relatively time consuming process, particularly in constraint driven contexts). Report 252 reports scan configuration based on existing scan structures, any as yet un-synthesized user scan specification, and/or system 205's default behavior for completion of the scan configuration. An example report 252 (-show cells) is shown below (see FIG. 6B):

```
Analyze scan report
Design: P
Version: Vx
Date: current date

Number of Chains:     2
Test methodology:     full_scan
Scan Style:           multiplexed_flip_flop
Clock domain:         no_mix
    (l) shows cell scan-out drives a lockup latch
    (s) shows cell is a scan segment
    (w) shows cell scan-out drives a wire
Scan chain '1' (test_si_1 --> test_so_1) contains 3 cells:
    childA/1
    childA/2
    childB/1
Scan chain '2' (test_si_2 --> test_so_2) contains 3 cells:
    childB/2
    childB/3
    childB/4
```

Analysis process 250 can also generate an output compiler generated script file 254. Script 254 is a complete specification of the scan configuration and is produced using the same commands valid for script 235. Therefore, the script 254 can be used by the user as a starting point for further specifications (e.g., script 254 can be input to specification process 230). In one embodiment of the present invention, scan structure is listed within script 254 based on the granularity specified by the user. For instance, if the user specifies scan chain membership by listing explicit sequential elements, script 254 lists these explicit cells; however, if the user specifies membership and ordering by design hierarchy, script 254 includes these less granular specifications.

For multiplexed flip-flop scan styles, analysis process 250 includes a determination of compatible and incompatible clock domains. Scan elements are assigned to clock domains, based on scan clock name and edge. Elements from compatible clock domains can be combined on the same scan chain. Elements with incompatible clock domains are included in separate scan chains. Generally, clock domain information is not pertinent to other scan styles (e.g., LSSD, etc.). Analysis process 250 can be invoked by the user without a previously existing script 235. In this instance, analysis process 250 follows a default behavior to produce script 254 which can be used as a starting point for further user specification. An exemplary command set for analysis process 250 is presented further below.

Synthesis Process 260. The synthesis process 260 of FIG. 1A of the present invention system 205 receives input from the database 210, including logic structure, interconnections and annotations. To invoke synthesis process 260, a user command is entered (e.g., insert_scan) and synthesis process 260 calls analysis process 250 to formulate or architect the required scan structure and then performs a scan insertion process which actually alters the database design 210 to construct the scan design (see FIG. 5). Therefore, synthesis process 260 results in a modification of the database 210 to include the implementation of the scan configuration characterized during the analysis process 250. As such, scan structure generated by synthesis process 260 can be viewed by reporting process 240. It is appreciated that the scan insertion processes of synthesis 260 can be implemented according to the detail described in application Ser. No. 08/581,187 U.S. Pat. No. 5,703,789 where scan replacements and scan routing occur. Synthesis process 260 is not typically invoked until a successful completion of the analysis process 250 is performed. FIG. 1A illustrates that in one embodiment of the present invention synthesis process 260 outputs a modified scan chain design database 260. However, alternatively, process 260 can alter database 210, directly obviating the need for a separate database 265. Scan structure constructed by synthesis process 260 is annotated with attributes by the scan insertion processes such that the scan structures are recognized as inferred segments upon further iterations within system 205.

It is appreciated that check test process 220 is typically executed after synthesis process 260 in order to check that any scan chains generated by process 260 are valid (e.g., can successfully shift data in and out) and performs other well known checks to determine that the scan cells can reliably capture data during the parallel capture cycle of the scan test sequence. Synthesis process 260 is described in more detail with respect to FIG. 5.

Figure 1B:
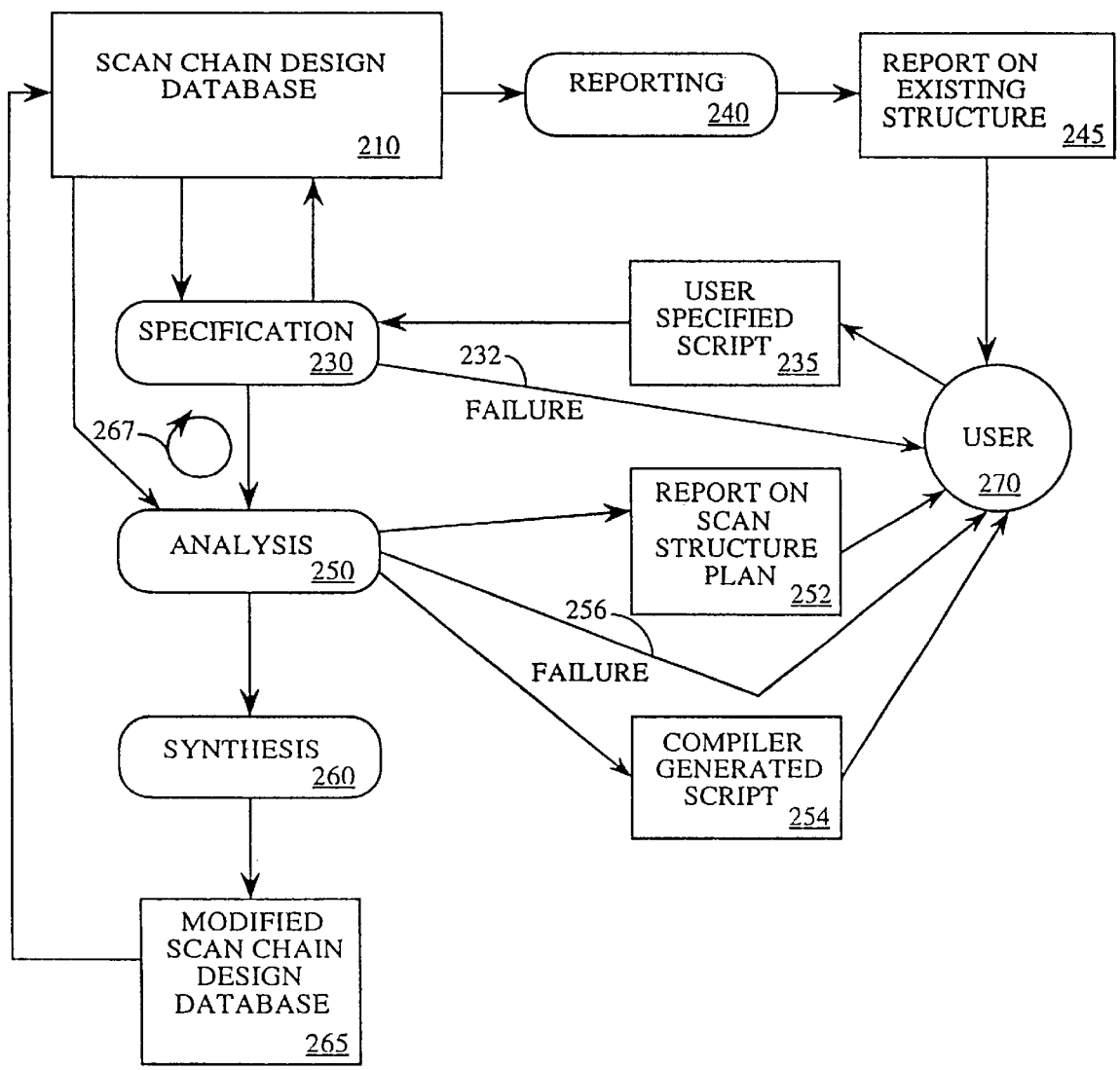
FIG. 1B is a process flow diagram illustrating the specification, reporting, analysis and synthesis processes of the hierarchical scan system of the present invention.

PROCESS SEQUENCE. FIG. 1B illustrates typical process sequences of system 205 according to the present invention. User 270 can originate design scripts 235 or can use the information of output script 254 of analysis system 250 as the starting point for additional user specification (e.g., use script 254, or an edited version of script 254, as input to specification process 230). The input scan chain database 210 interacts with specification process 230 which reads information from database 210 and annotates the database 210 with user specified commands from the user specified script 235. Inconsistencies in the script commands are reported over path 232 to the user. Next, analysis process 250 is invoked by the user and reads annotations in the database 210 to formulate a complete scan plan which can be reported to a computer screen (e.g., device 105) and then captured by a user into file 252 and/or file 254 which are both accessible by user 270. Script 254 completely describes the defined scan configuration and, as discussed above, can be inserted by the user 270 into specification process 230. Inconsistencies detected by analysis process 250 are reported to the user 270 over path 256.

As shown by FIG. 1B, it is possible to iterate in the specification process 230 and analysis process 250 loop 267 to correct inconsistent specifications and/or refine the scan configuration through additional user specifications. Once a proper analysis report 252 is obtained, the synthesis process 260 is executed by the user 270 to modify the database 210 (or create a new database 265) with the developed scan structures. The user can create a new database by copying database 210 before executing synthesis process 260. It is possible to execute multiple iterations through the synthesis process 260, successively adding to or changing the scan configuration implemented in the database 210. Multiple iterations through the synthesis process 260 can be associated with building scan configurations in different portions of the design of database 210 (e.g., via a bottom-up scan insertion technique). As shown by FIG. 1B, at any time in the processes of system 205, the report process 240 can be invoked to generate report 245 to obtain the existing scan structures. According to the exemplary process flow of FIG. 1B, it is appreciated that system 205 offers the user an advantage of formulating a scan design plan (reported in report 252 or script 254) without requiring the additional time consuming synthesis process 260. System 205 also supports ready modifications of this scan design plan before the actual scan configuration is architected. Check test 220 is typically invoked before specification process 230 and after synthesis process 260. An exemplary command set for synthesis process 260 is presented further below.

Scan Objects. System 205 recognizes the following types of scan objects within an IC design. 1) A scan cell is a scan replacement for a sequential cell. It exhibits scan equivalence with the sequential element it replaces. 2) Within the present invention, scan segments are serially connected ordered collections of one or more sequential elements and are scannable. Scan segments can include embedded functional shift registers that do not necessarily include visible pins at module boundaries and also do not necessarily include scan enable ports. Stimulus applied to a clocked scan segment's serial scan in can be observed at the scan segment's serial scan out. The input/output (I/O) of a scan segment need not be visible at the ports of some design. Segments are described in more detail below. 3) Scan elements are scan cells or scan segments (e.g., scannable sequential elements that are or will be included in a scan chain). 4) Within the present invention, a scan group is an unordered collection of one or more scan elements and can include groupings of unconnected scan elements (e.g., scannable cells and scan segments). 5) Scan links are structures that serially connect scan elements to other scan elements or to scan access pins. Scan links can be implemented as wires, multiplexers, lock-up latches, etc. 6) A scan chain is constructed of one or more scan elements, scan groups and scan links and through its scan signal ports is associated with one (and generally only one) hierarchical design. 7) Within the present invention, a scan access pin is a serial I/O or global signal (clock or control) connection point for a scan segment. 8) A scan signal pin is the internal design hook-up pin associated with a scan port. 9) A scan port is a port carrying a scan signal and generally refers to primary input/output accesses. 10) A scan design is a hierarchical design object that contains or is specified to contain a scan configuration.

Module designs. Modules stored within the IC design of database 210 of various scan insertion states that can be non-scan, heterogeneous, scan replaced test ready replaced or scan routed. A non-scan state results in the absence of a test ready compiler or constraint driven scan insertion output and any user-specification. Within the present invention, a sequential object is characterized as scan replaced if it has an attribute that indicates that it is scan replaced or is contained in a user defined or inferred scan segment. A design object is characterized as scan replaced if it has an attribute that indicates that it is test ready, scan replaced, or existing scan. A design object is characterized as scan routed if it has an attribute that indicates that it has existing scan (generally, its scan cells have been physically connected into a scan chain). A hierarchical design object can have a consistent set of scan insertion states associated with it and its children in which case its insertion state is either scan replaced or routed. However, if a hierarchical design as at least two subdesigns that do not have the same insertion state or if its scan insertion state differs from that of one or more of its children, it is heterogeneous.

Within the present invention, a scan signal is a test signal of type test scan in, test scan out, test scan enable, test scan enable inverted, test clock, test scan clock, test scan clock A or test scan clock B. Scan styles include mixed, multiplexed flip flop, LSSD, auxiliary clock LSSD, and clocked scan. Scan methodology includes partial or full scan, see co-pending application entitled, Method and Apparatus for Performing Partial Unscan and Near Full Scan within Design for Test Applications U.S. Pat. No. 5,696,771, filed May 17, 1996, Ser. No. 08/649,788 and assigned to the assignee of the present invention.

II. Scan Segments/Scan Links

Scan Segments. The present invention system 205 utilizes scan segments in order to effectively reuse subdesign scan chains that exist within modules of database 210 (e.g., inferred segment). Scan segments can also be specifically defined by the user to include scannable structure (e.g., user segment). Segments are: 1) user defined (defined by a user command); 2) inferred (e.g., automatically identified by system 210); 3) user inferred (an inferred segment then used by the user in a user command); 4) single bit scan segment (also called "base" segment); and 5) broken inferred (single bit scan segment that was previously part of an inferred segment). Within system 205, segments, or their individual membership, are not allowed to be shared between multiple scan chains within system 205, unless multiple scan configurations are supported. Scan segments can include embedded functional shift registers that do not necessarily include visible pins at module boundaries and also do not necessarily include scan enable ports. The analysis 250 and the synthesis 260 processes do not alter the functionality of a segment. For instance, the ordering of the elements and the connections within the segments are not altered. Certain size and electrical properties can be altered, however, during optimization within the synthesis process 260. System 205 does re-architect an inferred segment if the set_scan_ configuration -rebalance option is set true or membership of a segment or scan chain is specified by the user in a manner that is inconsistent with the membership of the segment.

When a scan segment is inserted into a scan chain, synthesis process 260 hooks the proper specified signals to the specified access points (e.g., pins) of the inferred segment.

A user defined segment (user segment) is defined using the set_scan_segment command described further below and is a serially connected ordered collection of one or more sequential cells and is scannable. Generally, a user segment contains a segment name, a set of access pins (for scan signals), and a member list of scan structures that makes up the scan membership. The access pins are not design ports. Although generally only one scan in and one scan out access pin is defined, a number of scan enable or scan clock access pins are allowed. If the membership order is not explicitly given, system 205 orders the membership alphabetically by name. If scan access pins are not specifically given, system 205 assumes the first sequential cell receives the scan in signal and the last sequential cell generates the scan out signal (no enables or clocks are assumed). An example of a user defined segment is an existing shift register circuit. User defined segment access pins are validated based on the scan style defined in the set_scan_configuration command (see below). An example user defined segment is shown below (dff=flip-flop):

set_scan_segment shift_register
        access {test_scan_in dff1/D, test_scan_out dff3/Q,
           test_scan_enable dff1/Sel}
        contains {dff1, dff2, dff3}

The scan segment, shift_register, receives its scan in at D input of flip flop 1, its scan out at Q of flip flop 3, and a scan enable at select input of flip flop 1. The segment contains three flip flops, dff1, dff2, dff3.

An inferred segment that exists within a module of design 210 is automatically detected by the analysis process 250 during scan chain architecting. Automatic detection is supported only if the database 210 contains annotations from the check test process 220 or from constraint driven scan insertion (discussed above). These processes place the annotations into database 210 while they are inferring or constructing the scan structure associated with the subdesign scan chain. In one embodiment, the report file 245 or the script 254 reports on inferred segments only by showing their scan structure included in a scan chain. In an alternative embodiment, an inferred segment can be reported to the user by the reporting process 240 in the report file 245 or in the script file 254 output from the analysis process 250 (which can produce set_scan_segment descriptions for each inferred scan segment). A broken inferred segment belongs to a segment that was inferred having a cell or cells within its membership used inconsistent with their membership of the same segment (e.g., one or more elements used in different scan chains). System 205 breaks inferred segments up into broken inferred segments and re-architects their scan structure. An example inferred segment script is shown below where the inferred segment is within module B (a child of P):

current_design=B
    set_signal_type test_scan_in SI
    set_signal_type test_scan_out SO
    set_signal_type test_scan_enable SE
    set_scan_configuration -existing_scan true
    check test
    current_design=P
    insert_scan
    check test Scan links. System 205 provides a mechanism for defining scan links that can be placed between scan structures of a scan chain. A scan link can be defined as either a wire or a lockup latch. The lockup latch is used to serially connect scan elements to other scan elements (or to scan access pins) in a scan chain. Lockup latches are used when a scan chain crosses two clock domains and system 205 automatically places these structures between clock domains when needed and when permitted. The lockup latch is placed in the signal path between the clock domains to retime the signal. By using the set_scan_link and set_scan_path commands (see below), the use of lockup latches and their placements can be specified by the user. As described further below, scan chains are constructed by the user using (single bit) base, user inferred, and user defined scan segments and scan links between segments specified by the set_scan_path command. In this manner, hierarchical scan insertion is employed that directly utilizes pre-existing scan structure within modules.

Figure 1C:
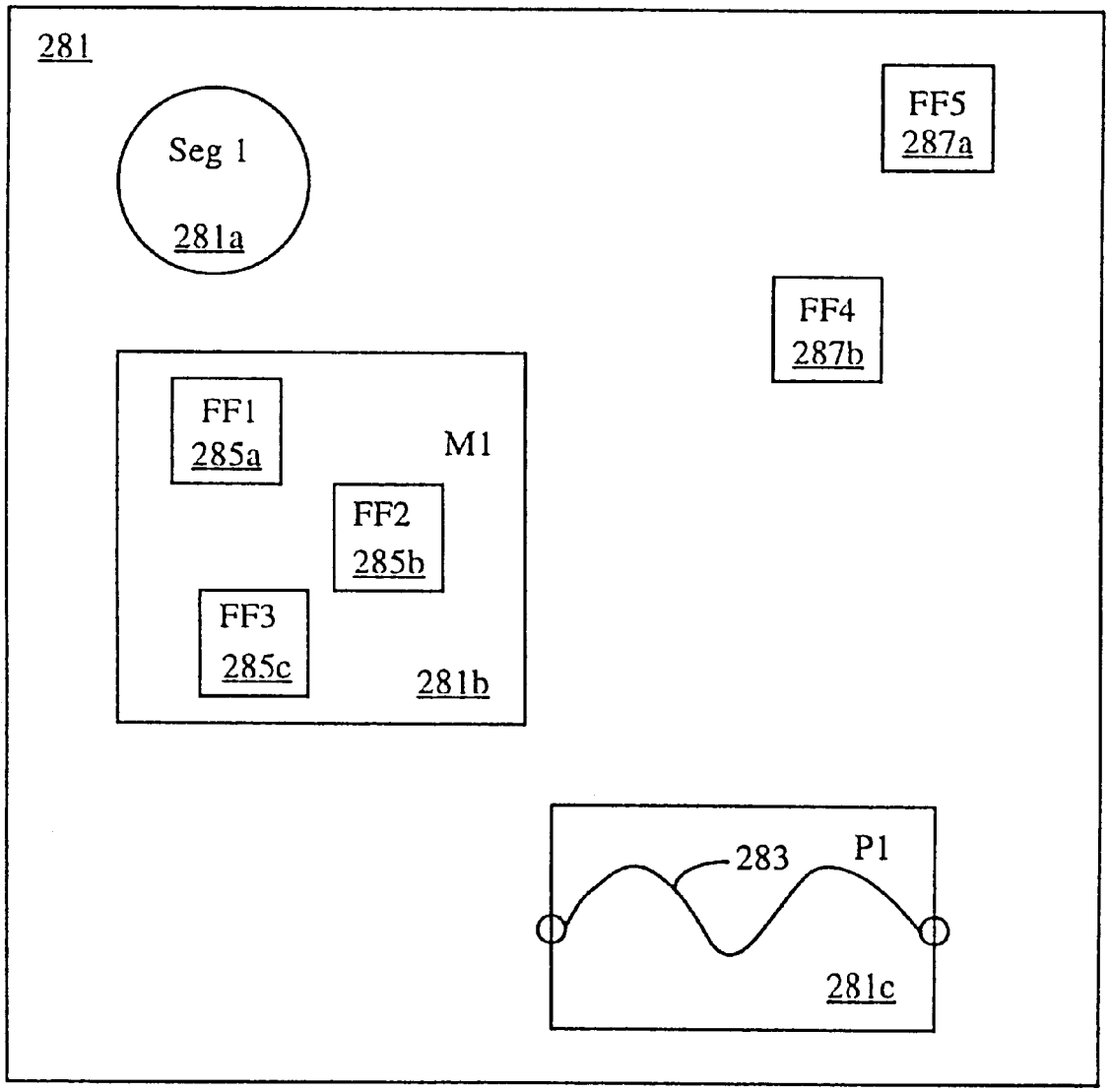
FIG. 1C illustrates an exemplary integrated circuit design.

FIG. 1C illustrates an exemplary IC design 281 including a user defined segment (Seg1) 281*a*, a module (M1) 281*b* containing flip flops: (ff1) 285*a*, (ff2) 285*b*, and (ff3) 285*c*, and a module (p1) containing an inferred segment 283 and two top level flip flops (ff4) 287a, and (ff5) 287b. The following set_scan_path command constructs a complete scan specification for this design 281:

set_scan_path chain1
{seg1, M1/ff1, M1/ff2, M1/ff3, p1, ff5, ff4}

Alternatively, if check_test 220 reports that inferred segment 283 is scan chain #1 in module P1, the user can include this inferred segment directly within a set_scan_path command (e.g., {seg1, M1/ff1, M1/ff2, M1/ff3, p1/1, ff5, ff4}). In this case, p1/1 is referred to as a "user inferred" segment. The scan chain defined by the above set_scan_path command commences through the user defined segment (seg1) 281a, then through ff1, ff2 and ff3 of M1 281b, then through the inferred segment 283 within p1 281c, then through ff5 and then ff4 of the top level design. If the -complete option was true, this would be the only scan structure within chain1. If -complete was not set true, and additional scan structure was present, system 205 can add this additional can structure to chain (without disturbing the defined order of seg1, M1/ff1, M1/ff2, M1/ff3, p1, ff5, ff4) during balancing. Links could be placed between the elements of chain1 if the scan style is multiplexed flip-flop and there are multiple clock domains, or if the user specified the links explicitly. The following set_scan_path command constructs two scan chains, one through module M1 only and the second through seg1, instance p1, ff5 and ff4:

set_scan_path chain1
{instM1}-complete
set_scan_path chain2
{seg1, p1, ff5, ff4}

III. System 205 Behavior Without User Specification

Analysis process 250 can define and synthesis process 260 can synthesize a scan configuration without user input into the scan chain design process. Section III describes the default behavior of the above processes of the present invention system 205 without user specification. If no test methodology is specified, system 205 implements a default scan design using the full scan methodology.

System 205 allocates scan elements to produce the minimum number of scan chains consistent with clock domain requirements. By default, system 205 generates a scan design, which contains the number of scan chains equal to the number of clock domains. The resulting design 210 contains one scan chain for each set of sequential elements clocked by the same edge of the same test clock.

System 205 also automatically infers existing scan chains both in the current design 210 and in any subdesigns stored therein. Inference is based on annotations placed within database 210 by the check test process 220 or by scan insertion. Therefore, scan segments can be specified (e.g., by a user specification command, see further below) or they can be inferred by the analysis process 250. An inferred segment is not altered by the system 205 in default mode.

It is appreciated that system 205 does not reroute existing scan chains or subdesign scan chains built by constraint driven scan insertion, or by system 205, even if the existing routing does not conform to default system 205 behavior. Unless explicitly instructed to the contrary by user specifications, a properly scan routed scan chain is not modified by system 205 (user defined scan segments are generally never modified). During scan chain construction, the analysis process 250 of system 205 orders scan elements in scan chains alphanumerically within scan chains across the full hierarchical path specification of the scan element name.

System 205 of FIG. 1A also automatically inserts and routes global test signals to support the specified scan style. These test signals include clocks and enable signals. By default, system 205 also allocates ports to carry test signals. Where possible, system 205 uses mission (normal function) ports to carry test signals unless specifically instructed otherwise by user specification. System 205 also inserts multiplexing logic, if required. System 205 checks for existing multiplexing logic to prevent redundant insertion. System 205 also inserts any required three-state and bi-directional disabling logic during default scan synthesis 260. System 205 also checks for existing disabling logic to prevent redundant insertion.

Specification commands allow the insertion of three-state disabling logic where the user can control whether three-state or bi-directional disabling logic insertion occurs during scan synthesis process 260. Where the design in 210 includes pads, system 205 identifies the pads and correctly jumps over them to insert test structures on the core side of the pad according to the below processes. System 205 obtains requirements and if necessary inserts required disabling logic for all bi-directional ports based on the value of the set_scan_configuration -bidi_mode input/output option (described below), forces all non-degenerated bi-directional pads not carrying test signals into "input" mode or "output" mode during scan shift only. System 205 also forces bi-directional pads carrying scan out signals into "output" mode during scan shift and forces bi-directional pads carrying scan-in, control, and clock signals into "input" mode during scan shift. System 205 obtains requirements and if necessary also checks for the existence of disabling and muxing logic to prevent redundant insertion, and ensures that three-state output pads associated with scan-out ports are correctly enabled during scan enable.

By default, system 205 uses constraint-optimized scan insertion (see application Ser. No. 08/581,187 U.S. Pat. No. 5,703,789) to reduce scan-related performance, power and area impact by minimizing constraint violations and eliminating compile design-rule errors. It is appreciated that synthesis process 260 is primarily concerned with the scan shift operation. Problems associated with scan capture are identified by check test process 220 and might require user resolution of problems caused by functional clock waveforms.

IV. System 205 Behavior With User Specification

Without user specification of scan requirements, system 205 implements a default scan design using the full scan methodology, as described above in section III. Specification commands from script 235 alter this default scan design. Discussed below, are processes taken by system 205 based on user specification and the manner in which system 205 resolves conflicts when specifications are not self consistent.

Permitted Specifications. To ease specification, the user can identify scan objects, such as scan chains, scan ports, scan cells, scan segments, or scan links, with any acceptable name, subject to the requirements of uniqueness. Subject to consistency, the user can modify the specifications described in the following sections. Regarding scan implementation, the user can specify: (1) the scan methodology for a design; and (2) the scan style for a design. Scan segments or chains defined in the context of a design are assumed to have the same style as the design.

Regarding scan element allocation, system 205 is able to process the following specifications. First, system 205 allows specification of the exact number of scan chains. When the user specifies the exact number of scan chains desired, system 205 produces that number of scan chains and allocates scan elements (which have not been explicitly allocated to specific scan chains) to scan chains to favor a balanced scan design. System 205 allows the mixing of clock domains in scan chains and three types of specification are permitted which instruct system 205 to perform the following actions. Specification commands instruct System 205 to segregate scan elements based on test clocks and edge types. Specification commands instruct System 205 to segregate scan elements based on test clocks while supporting mixed edges in the same scan chain. The scan elements are then sorted so that the capture edge time of the next scan element precedes the launch edge time of the previous element. Specification commands also instruct system 205 to permit mixing of scan elements of different clocks and clock edges in the same scan chain. The scan elements are then sorted so that the capture edge time of the next scan element proceeds the launch edge time of the previous element and clock domain boundary transitions are minimized. In addition, because an analysis of skew problems resulting from different clock sources can be made, the user can instruct system 205 to introduce (default) or not introduce or selectively introduce lock-up latches where incompatible clock domains from different sources are traversed in the same chain.

User specification commands can also alter the manner in which system 205 allocates existing scan chains. System 205 identifies and respects existing scan chains in lower-level modules where the user has either inserted these scan chains using synthesis process 260 or has imported them and run check test process 220 to identify them as valid scan chains. By default, system 205 does not reroute existing scan structures. In default mode, invoking analysis 250 at the top level design of database 210 results in the definition of a scan design with existing scan chains that appear as inviolate. In order to cause system 205 to reroute existing chains to produce balanced designs, the set_scan_configuration -rebalance true command (described below) is used. This command explicitly instructs system 205 to break up existing scan chains to produce balanced designs as needed.

Specification commands can be used to define the existence of scan segments. The user can identify an existing shift register, or similar structure, with the set_scan_segment command (described below). Specification commands can also be used to define the ordering of scan links and scan elements within a scan chain. Subject to ordering consistency, system 205 supports the user defining any ordering of scan links and scan elements in a scan chain. System 205 allows the user to define the order so that a scan chain has multiple reentries into a level of hierarchy.

Specification commands can also be used to define the associations between scan objects. Subject to requirements of consistency, these associations include the following. The first association includes associating any scan chain with any single scan design. The input/output (I/O) ports associated with any scan chain exist on only one design. The second association includes placing any scan link or scan element in any scan chain, subject to clock domain requirements. The third association includes establishing a one-to-one relationship between a scan port and an associated hook-up pin. The fourth association includes establishing a relationship between a scan access pin and an associated scan segment. The fifth association includes establishing Ser. relationships between scan elements, scan access pins, and signal pins using scan links. The scan links connect the scan objects for which the relationship has been established.

Specification commands allow the user to specify complex configurations of global test signals. However, the user cannot specify multiple scan enables, unless multiple scan configurations are supported. Such specifications need to be entirely unambiguous. An unambiguous specification is sufficient to produce a complete mapping between test signals, test ports, and scan chains. Specification commands also allow the user to define scan test ports where the user can specify the scan signal type for a scan port.

User specifications are required to be consistent and system 205 performs conflict resolution. User-supplied specification commands forming part of a consistent specification have the following characteristics within the present invention. Each specification command is self-consistent. In one embodiment, it cannot contain mutually exclusive requirements. For example, a command specifying the routing order of a scan chain cannot specify the same element in more than one place in the chain. In one embodiment, all specification commands are mutually consistent. Two specification commands should not impose mutually exclusive conditions on the scan design. For example, two specification commands that place the same element in two different scan chains are mutually incompatible. In one embodiment, all specification commands yield a functional scan design. The user cannot impose a specification that leads to a nonfunctional scan design. For example, the number of clock domains in the design database 210, together with clock mixing specifications, determine the minimum number of scan chains in the present design. If the user specifies an exact number of scan chains smaller than this minimum, system 205 issues a warning message and implements the minimum number of scan chains.

Because optimization is fundamentally a search problem, one embodiment of the present invention allows the user to adjust the amount of processor effort employed during synthesis process 260 by user specification commands. For scan design optimization, user control of low, medium, or high processor effort has the following effect. A low map effort (map_effort) tries to confine optimizations to the added test logic. A medium map effort executes critical path optimization on the entire design. This is the default. A high map effort executes critical path optimization and area optimization on the entire design. For more detail, see application Ser. No. 08/581,187. System 205 implements area optimization through downsizing and removing extra inverters.

Exemplary Specification Command Structure. The following discussion illustrates exemplary specification command structure recognized by system 205 to implement the above permitted specifications. These commands can be entered in-line to specification process 230 or can be stored in a list of commands (e.g., a script 235). It is appreciated that the following specification commands are exemplary and that other command syntax can be adopted and utilized within the scope of the present invention.

SET_SCAN_CONFIGURATION.

The present invention processes this command to specify the scan chain design and constrains the manner in which system 205 makes designs scannable. The exceptions are specific to particular scan chains and are included in set_scan_path command options. An exemplary syntax is:

```
set_scan_configuration
    [-add_lockup true |false]
    [-bidi_mode input |output]
    [-chain_count integer_or_default]
    [-clock_gating entire_design | leaf_cell | superbuffer]
    [-clock_mixing no_mix | mix edges |mix_clocks]
    [-dedicated_scan_ports true |false]
    [-disable true |false]
    [-existing_scan true |false]
    [-hierarchical_isolation true |false]
```

[-methodology full_scan |partial_scan |none]
[-replace true |false]
[-route true |false]
[-rebalance true |false]
[-style multiplexed_flip_flop |clocked_scan |ssd | aux_clock_ssd |combinational |none]

add_lockup true |false. This argument instructs synthesis process 260 to insert lock-up latches between clock domain boundaries on scan chains. Synthesis process 260 inserts lock-up latches by default, so to disable lock-up latch insertion, this argument is set to false. Synthesis process 260 ignores the argument if the scan style is not multiplexed flip flop. The user can always insert lockups manually.

bidi_mode input |output. This argument specifies whether synthesis process 260 configures bi-directional ports in a design as inputs or outputs during scan shift. By default, synthesis process 260 turns bi-directional ports inward during scan shift to eliminate any possibility of board-level contention. This argument is set to output to turn bi-directional ports outward. Synthesis process 260 ignores the argument if there are no non-degenerated bi-directional ports that are not configured as scan ports or the user set -disable to false.

chain_count integer_or_default. This argument instructs synthesis process 260 to build a specified number of scan chains or to revert to its default behavior. By default, synthesis process 260 builds the minimum number of scan chains consistent with clock mixing constraints. By specifying a positive integer, the user instructs synthesis process 260 to build exactly that number of chains.

clock_grating entire_design |leaf_cell |superbuffer. This argument applies only when the user is using a partial scan methodology. This option instructs synthesis process 260 about the kind of clock gating logic to insert. Clock gating can be at the leaf cell or entire design level. When the user requests super-buffer clock gating, synthesis process 260 infers a super-buffer in the scan clock tree, inserts clock gating logic before the super-buffer, and inserts an additional super-buffer at the root of the gated clock tree. By default, synthesis process 260 uses entire design clock gating.

clock_mixing no_mix |mix_edges |mix_clocks. This argument specifies whether analysis process 250 can include cells from different clock domains in the same scan chain. The default value no_mix instructs synthesis process 260 that scan chains can only contain cells that are clocked by the same clock edge. A mix_edges value instructs synthesis process 260 that scan chains can contain cells clocked by different edges of the same clock. A mix_clocks value instructs synthesis process 260 that scan chains can contain cells clocked by different clocks.

dedicated_scan_ports true |false. By default, synthesis process 260 does not implement dedicated scan-out signal ports on the current design 210. It uses mission-mode ports as scan-out ports whenever possible. This argument is set to true to implement dedicated scan-out signal ports.

disable true |false. By default, synthesis process 260 inserts disabling logic. This argument ensures that, during scan shift, three-state buses have exactly one active driver and that non-scan bi-directional port modes are controlled. This argument is set to false if the user does not want to insert disabling logic.

existing_scan true |false. Synthesis process 260 assumes that designs it has not processed do not have scan chains. This argument is set to true if the user is processing an imported design that does have scan chains. This argument informs check_test 220 to apply post can checks to the design 210.

hierarchical_isolation true |false. This argument instructs synthesis process 260 to build hierarchical isolation logic when the user sets the option to true. This means that dedicated subdesign scan-out signals are gated by the design scan enable signal. By default, synthesis process 260 does not build hierarchical isolation logic.

methodology full_scan |partial_scan |none. This option selects the test methodology. Synthesis process 260 makes all sequential cells that do not violate scan design rules scannable in full_scan methodologies. A partial scan methodology trades off the area and timing penalties of full scan at the expense of testability and test pattern generation time by identifying valid nonscan cells and leaving them off scan chains. A methodology of none resets the scan methodology. By default, synthesis process 260 uses full_scan methodologies.

replace true |false. By default, synthesis process 260 replaces sequential cells that are not violated by scan design rule checking with scan cells. This argument is set to false if the user does not want scan replacement.

route true |false. By default, synthesis process 260 routes scan signals. This argument is set to false if the user does not want scan routing.

rebalance true |false. By default, synthesis process 260 respects existing scan chains, including those in subdesigns, when architecting scan chains. This argument is set to true if the user wants analysis process 250 to split up existing scan chains to produce scan architectures with more balanced scan chains.

style multiplexed_flip_flop |clocked_scan | lssd | aux_clock_lssd | combinational |none.

This argument identifies the scan style. None is selected to reset the scan style for the design. By default, synthesis process 260 uses the scan style value specified by known environment variables in setup files.

SET_SCAN_PATH

This command allows the user to specify a scan chain for the current design database 210. Set_scan_path allocates scan cells, scan segments and user inferred scan segments, and scan links to scan chains and specifies scan chain orderings. In the present invention, scan chain elements cannot belong to more than one chain. Where set_scan_path commands conflict, system 205 acts upon the most recent command. Where links are not specifically defined, system 205 automatically provides them. An exemplary syntax is shown below:

set_scan_path
  scan_chain_name
  [ordered_list]
  [-dedicated_scan_out true |false]
  [-complete true |false]

This arbitrary text string scan_chain_name gives the scan chain a name. The ordered_list argument defines scan chain elements. This ordered list can include sequential cells, design instances, scan segments, user inferred scan segments, and scan links. In one embodiment, the user can use wildcards and Design Compiler shell command expressions like all_registers( ), filter( ), and find( ) to identify design objects. The relative order of scan elements in the ordered_list is respective, however, system 205 can insert additional scan elements into the scan chain before these elements if the -complete option is not set to true.

dedicated_scan_out true |false. The last scan cell in a chain can drive a port in mission mode. By default, synthesis process 260 uses this port as a scan-out port. This argument is set to true if the user wants synthesis process 260 to build a dedicated scan-out port for the chain.

complete true |false. This argument allows analysis process 250 to add components to a specified scan chain if set to false. This argument is set to true to indicate to system 205 that the chain specification is complete and additional components should not be added during chain architecting.

SET_SCAN_SIGNAL

This command specifies one or more scan signals for the current design 210 and associates scan signals with scan ports, scan signal access pins and scan chains of the current design. This command allows the user to use existing ports to which to connect signals (e.g., scan in, scan out, scan enable). An exemplary syntax is shown below:

set_scan_signal
        test_signal_type
        [-port port_list]
        [-hookup pin_name]
        [-chain scan_chain_list]

Test_signal_type describes the type of the signal. In one embodiment, valid types include test_clock, test_scan_clock, test_scan_clock_a, test_scan_clock_b, test_scan_enable, test_scan_enable_inverted, test_scan_in, and test_scan_out. Validation of the specification process 230 ensures that specified types are consistent with the design scan style.

port port_list. This argument identifies design ports that synthesis process 260 can use to transmit signals of the specified type. Validation ensures that the port direction is consistent with the signal type.

hookup pin_name. Synthesis process 260 connects wires to the core side of identified signal ports, jumping pads, and buffers as needed. This argument overrides this behavior and instructs synthesis process 260 to connect wires to a specific pin. Validation ensures that the pin direction is consistent with the signal type. In one embodiment, the user can associate a specific access pin with only one design port.

chain scan_chain_list. By default, synthesis process 260 assigns scan signals to scan chains. This argument allows the user make the assignment. Two examples are shown inst=instance).

SET_SCAN_ELEMENT

The present invention processes this command to determine if scan cells replace sequential cells and become part of the scan path during synthesis process 260. For full scan designs, synthesis process 260 replaces all non-violated sequential cells with equivalent scan cells by default. As a result, the user does not need to initially set the scan_element attribute to true. Sequential cells with the scan_element attribute set to false are not replaced by equivalent scan cells. An exemplary syntax is shown below:

set_scan_element
        true |false
        cell_design_ref_list

The argument, true |false, is a Boolean value that determines whether or not scan cells replace sequential cells in the design and cell_design_ref_list is a list of design objects for scan replacement. Objects must be of the following sequential types: (1) cells (such as flip-flops and latches), hierarchical cells (containing flip-flops or latches), (3) references, (4) library cells, and (5) designs. The following example constructs a scan chain through instA and instB but ignores one flip flop (dff4) within instB (instA and instB are children of P):

current design=P
    set_scan_element false instB/dff4
    preview_scan -show {cells, scan}
    insert_scan
    check test
    report_test -scan_path The following example constructs a scan chain but excludes all cells of instance A except dff4:

current design=P
    set_scan_element false instA
    set_scan_element true instA/dff4
    preview_scan -show {cells, scan}
    insert_scan
    check test
    report_test -scan_path

SET_SCAN

The present invention processes this command to designate cells as transparent for rule checking and test generation within the present invention. The syntax is shown below.

set_scan
        false
        cell_design_ref_list
        transparent

Argument, false, is a Boolean value that indicates scan cells should not replace latches in the design because they are transparent. Cell_design_ref_list is a list of design objects for which scan replacement is specified. Objects must be of the following sequential types: (1) latches, (2)

| Example script: | With Mulfiple Chains: |
|---|---|
| check test | check test |
| set_scan_signal test_scan_m-port TI | set_scan_path scan 1 {instC} |
| set_scan_signal test_scan_out-port TO | set_scan_path scan2 {instA, instB} |
| set_scan_signal test_scan_enable-port TE | set_scan_signal test_scan_in -port SI1 -chain scan2 |
| preview_scan | set_scan_signal test_scan_in -port SI2 -chain scan1 |
| insert_scan | preview_scan |
| check test | insert_scan |
| | check test | hierarchical cells (containing latches), (3) references, (4) library cells, and (5) designs.

transparent. This argument indicates that the designated cells be treated as transparent for rule checking and test generation.

SET_SCAN_SEGMENT

The present invention processes this command to identify existing logic within a current design 210 as a scan segment. Scan segments implement scan in a particular scan style. System 205 can include scan segments in scan chains by connecting their access pins. Synthesis process 260 does not scan replace scan segment members. The exemplary syntax is shown below:

set_scan_segment
        scan_segment_name
        [-access signal_type_pin_pairs]
        [-contains member_list]

The scan segment name gives the scan segment a name.

access signal_type_pin_pair_list. This argument instructs synthesis process 260 on the manner in which to access the segment. This argument consists of a list of ordered pairs, each consisting of a scan signal type and a design pin associated with the scan signal type. Valid signal types include test_clock, test_scan_clock, test_scan_clock_a, test_scan_clock_b, test_scan_enable, test-scan_enable_inverted, test_scan_in, and test_scan_out. Validation ensures that specified signal types are consistent with the design scan style.

contains member_list. This argument defines scan segment components. This ordered list can include sequential cells and design instances. The user can use wildcards and Design Compiler shell command expressions like all_registers( ), filter( ), and find( ) to identify design objects.

SET_SCAN_LINK

The present invention processes this command to declare a scan link for the current design 210. Scan links connect scan cells, scan segments, and scan ports within scan chains. System 210 supports scan links that are implemented as wires and scan-out lock-up latches. The exemplary syntax is shown below:

set_scan_link
        scan_link_name
        wire |scan_out_lockup

The scan_link_narne indicates the name of the scan link. The wire |scan_out_lockup specifies the scan link type. This can be a wire or a lock-up latch design that retimes scan cell scan-out signals when they cross clock domains. The following example constructs a lockup latch as a link and uses the link in a scan chain:

set_scan_link lockup scan_out_lockup
    set_scan_path {instA/dff1, instA/dff2, lockup, instb}
    preview_scan
    insert_scan
    check test

REMOVE_SCAN_SPECIFICATION

The present invention processes this command to remove scan specifications from the current design 210. This command deletes specifications made using the set_scan_configuration, set_scan_link, set_scan_path, set_scan_segment, and set_scan_signal commands. The user can use the -all option to delete all such specifications and other command options to delete specific specifications. It is appreciated that remove_scan_specification does not change the user design. The command deletes specifications the user have made. The exemplary syntax is shown below:

remove_scan_specification
        [-all]
        [-chain chain_name_Elist]
        [-configuration]
        [-link link_name_list]
        [-segment segment_name_list]
        [-signal port_name_list]

all. This argument removes all set_scan_path, set_scan_configuration, set_scan_link, set_scan_segment, and set_scan_signal command specifications from the design 210.

chain chain_name_list. The argument removes all specifications that reference scan chains in chain_name_list. This command removes associated set_scan_path command specifications from the design 210 and updates set_scan_signal command specifications.

configuration. This command restores set_scan_configuration command options to default values.

link link_name_list. This argument removes all specifications that reference scan links in link_name_list. This argument removes associated set_scan_link command specifications from the design and updates set_scan_path command specifications.

segment segment_name_list. This argument removes all specifications that reference scan segments in segment_name_list. This argument removes associated set_scan_segment command specifications from the design and updates set_scan_path command specifications.

signal port_list. This command removes all specifications that reference scan signals associated with design ports in port_list. This argument removes associated set_scan_signal command specifications from the design.

PREVIEW_SCAN

The present invention processes this command to preview a scan design 210 and invokes analysis process 250. The command generates a scan chain design that satisfies scan specifications on the current design 210 and displays the scan chain design. The command causes system 205 to display the design that matches the scan chain design presented to synthesis process 260 for synthesis. This allows users to preview their scan chain designs without synthesizing and change their specifications to explore the design space as necessary. The exemplary syntax is shown below.

preview_scan
        [-script]
        [-show cells |scan |scan_clocks |scan_signals |segments |all]
        script. This argument instructs analysis process 250 to produce the script 254 that specifies the defmed scan design. The script 254 is written to standard output.
        show cells |scan |scan_clocks |scan_signals |segments |all. This argument instructs analysis process 250 to report information of various types, in addition to the summary report it produces by default. The option takes a list of arguments in cells, scan, segments, scan_clocks, and scan_signals or the keyword all.

INSERT_SCAN

The present invention processes this command to add scan circuitry to the current design 210 and invokes the synthesis process 260 (FIG. 1A). Scan circuitry is chosen from a technology library that is specified using a number of well known techniques. Synthesis process 260 supports top-down, bottom-up, and middle-out scan insertion methodologies. In the process of adding test circuitry, synthesis process 260 creates testable versions of the subdesigns and top-level design. Using a write command, all of these new designs can be written to disk (e.g., unit 104 of FIG. 15). For subdesigns that are made testable, synthesis process 260 creates new designs in the database that are distinct from the original subdesigns. System 205 names the new subdesigns according to a predefined variable. In one embodiment, the name of the top-level design is not changed during synthesis process 260. The syntax is shown below.

insert_scan
        [-map_effort low |medium |high]
        [-ignore_compile_design_rules]
            map_effort low |medium |high. This argument specifies the relative amount of processor 101 (FIG. 15) time spent during the mapping phase of synthesis process 260. The default is medium. A low-map_effort executes critical path optimizations on logic that synthesis process 260 adds to the design. A medium-map_effort executes the same optimizations as -map_effort low. If constraints are violated, it executes critical path optimizations on the entire design. A high -map_effort executes the same optimizations as -map_effort medium. If constraints are violated, it applies sequential mapping to sequential cells on critical paths. It also tries to reduce design area by eliminating inverters and downsizing cells off critical paths.
            ignore_compile_design_rules. This argument indicates that synthesis process 260 is to exit before correcting compile design rule violations. This option allows the user to do a relatively quick synthesis to get preliminary results concerning design area and performance. By default, synthesis process 260 corrects compile design rule violations (for example, max_transition, max_fanout, max_capacitance, and min_path) and performs mapping optimizations before exiting.

REPORT_TEST

The present invention processes this command to display test-related information about the current design in 210 and invokes the reporting process 240. In reporting process 240, according to this command, the type of information to be displayed is selected and one or more report sections is specified. Some of the sections have options to further control the report content. The user can select as many different reports as desired, but in one embodiment, the user cannot select the same one more than once. A current design of 210 needs to be specified before using reporting process 240. An exemplary syntax is shown below.

report_test
        [-configuration]
        [-port]
        [-scan_path]
        [-nosplit]
            configuration. This argument selects the configuration report for display. This report contains a list of scan configuration settings for the current design, as specified by the set_scan_configuration command. The scan configuration for the design includes, among other things, information about the test methodology, the scan style for the design, number of scan chains desired, and type of clock mixing.
            port. This argument selects the port report for display. This report contains details of test ports for the current design. Displays (if applicable) signal type, scan chain index, clock attributes, and JTAG attributes, for example.
            scan_path. This argument selects the scan path report for display. This report contains a list of every scan cell on the scan path for the current design.
            nosplit. In one embodiment, most design information is listed in fixed-width columns.

If the information for a given field exceeds its column's width, the next field begins on a new line, starting in the correct column. This option prevents line splitting and facilitates writing software to extract information from the report output.

V. Scan Chain Construction, Balancing and Preprocessing Steps of Analysis Process 250

Figure 2A:
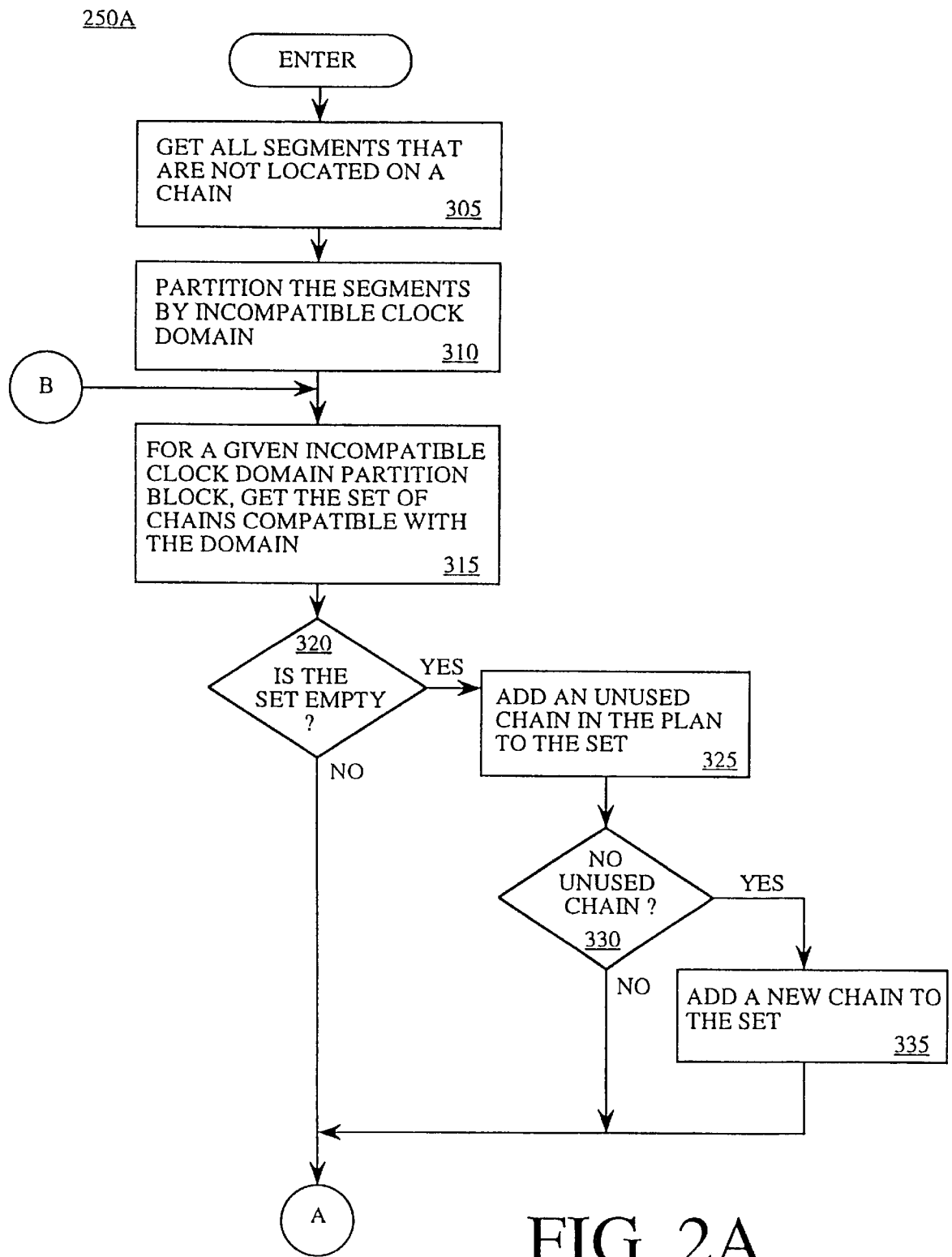
FIG. 2A and FIG. 2B illustrate process steps performed within the analysis process of the present invention for balancing of scan chains.
Figure 2B:
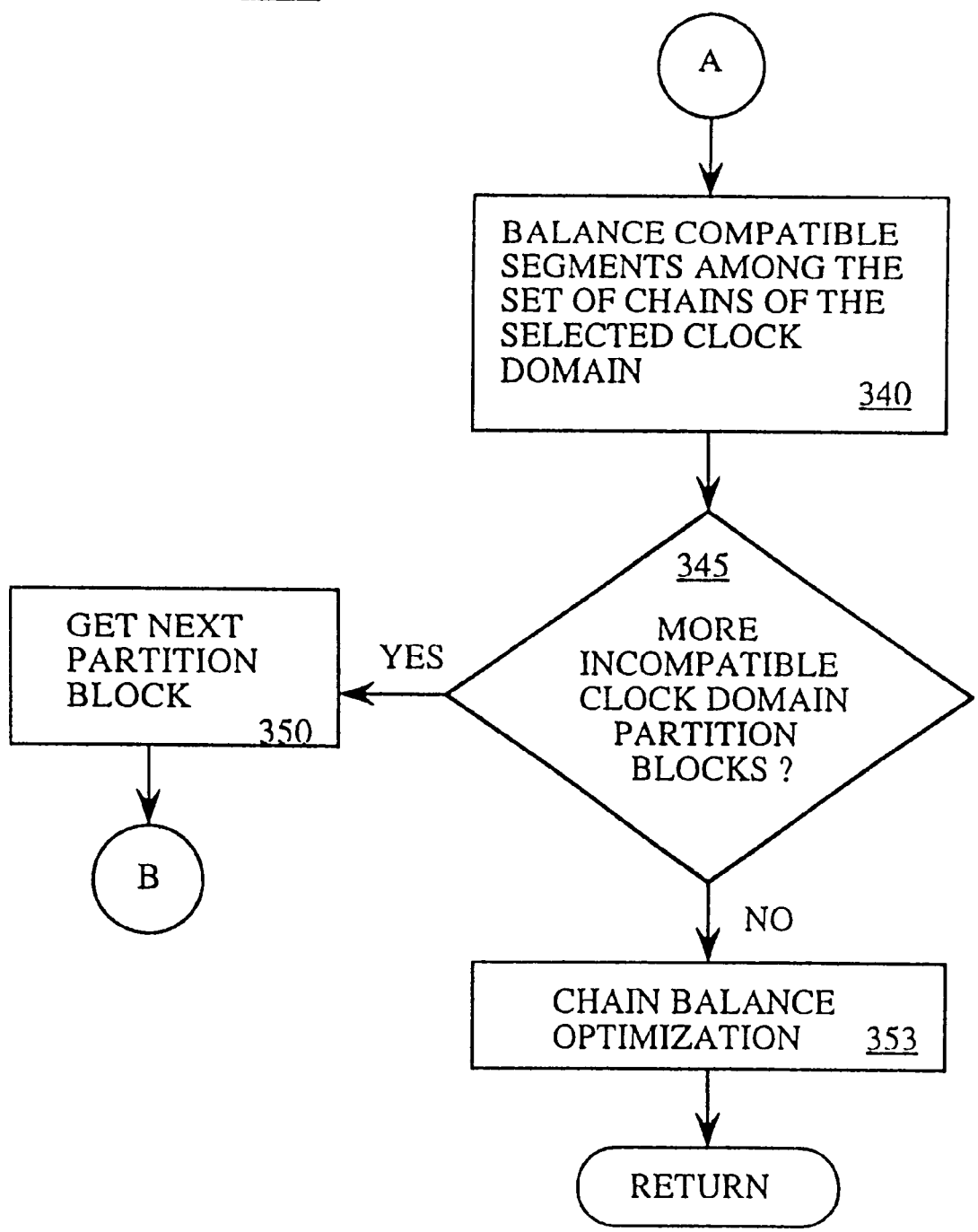
Figure 4A:
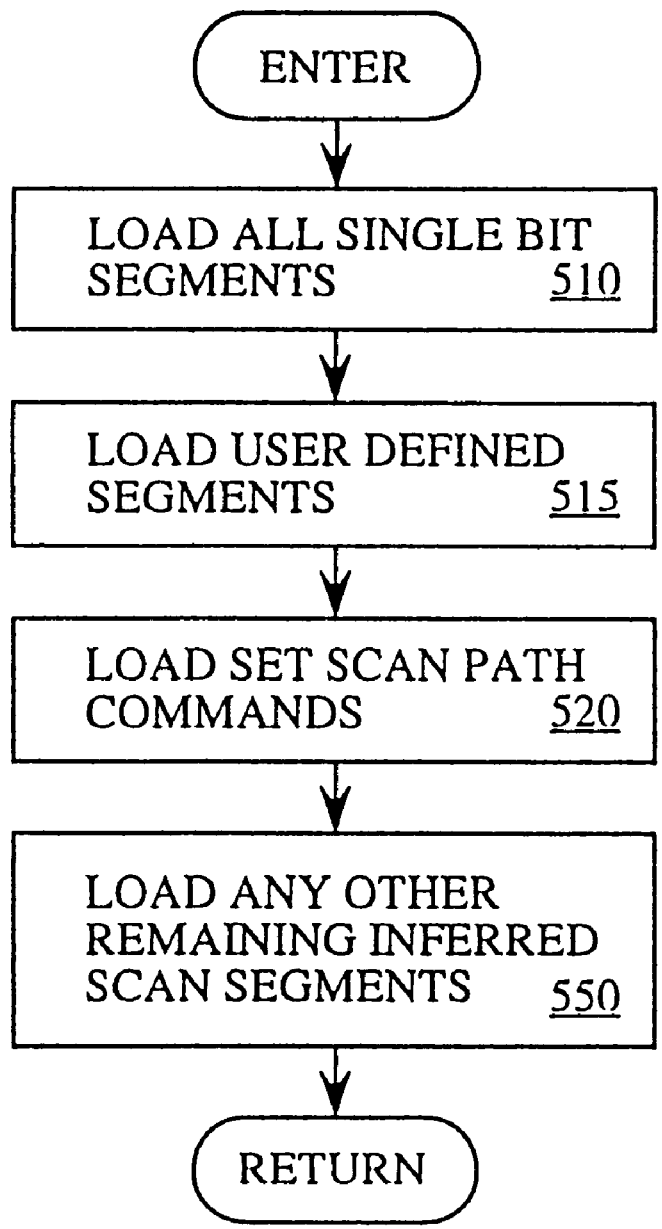
FIG. 4A illustrates pre-processing steps performed by the present invention within the analysis process for identification of segments in preparation for balancing.
Figure 4B:
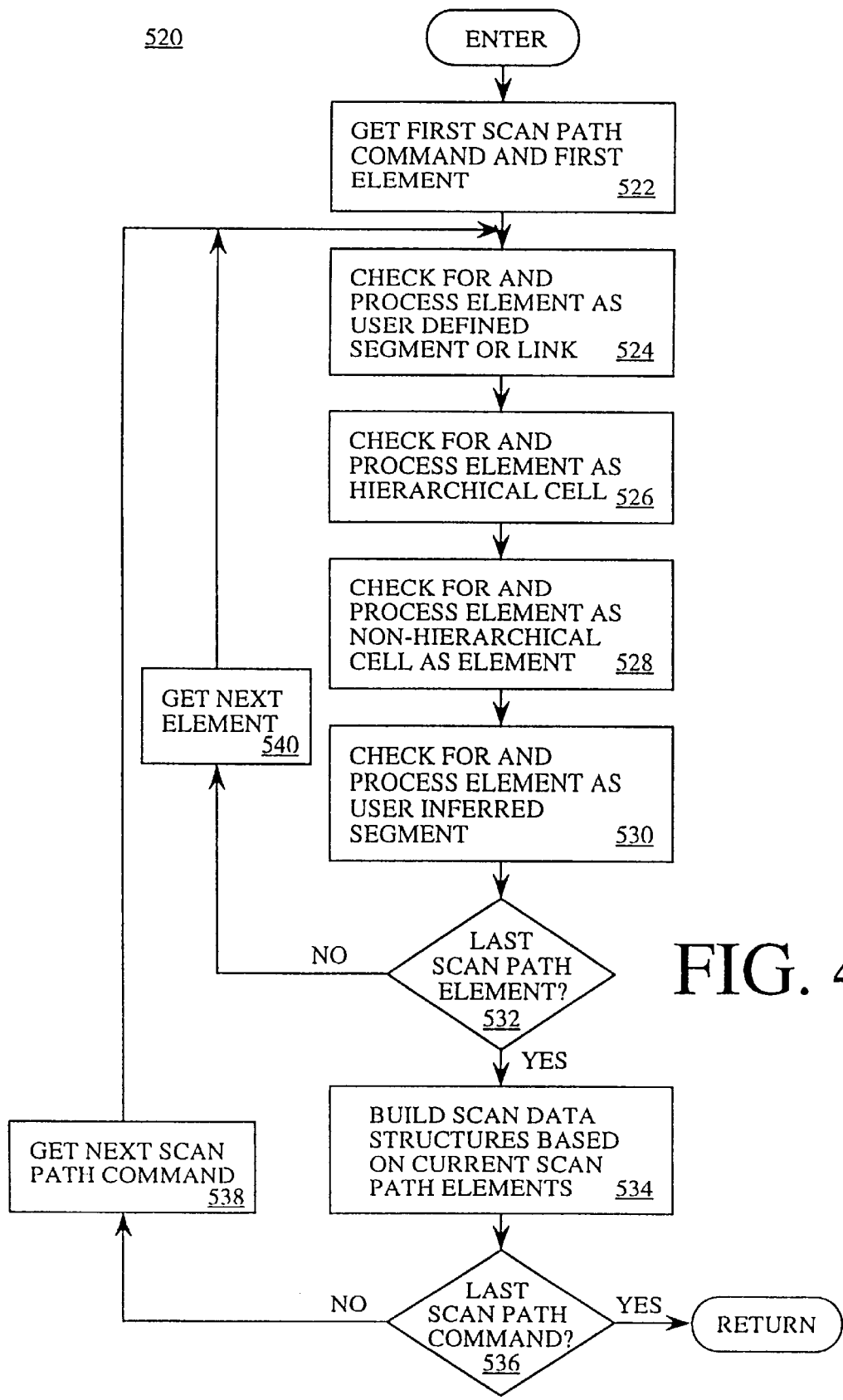
FIG. 4B illustrates pre-processing steps performed by the present invention within FIG. 4A for pre-processing set scan path commands.

FIG. 2A and FIG. 2B illustrates steps of process 250A performed by analysis process 250 in order to create a default complete specification of scan chains for the current design. This scan specification is constructed in a scan plan, and the logic cells within database 210 are not altered; therefore, any association or disassociation of scan structure performed by process 250A is maintained by the scan plan. The process steps described with respect to FIGS. 4A and 4B are pre-processing steps performed in advance of process 250A. The steps of process 250A are realized as program code or instructions within a computer readable memory unit of CAD system 112 (FIG. 15) and executed on processor 101. It is assumed that a current design has been selected and check test 220 has been executed on the current design and that all subdesigns that have scan chains.

At step 305 of FIG. 2A, the present invention accesses all segments, e.g., (single-bit) base segments, inferred segments, broken inferred segments, or user defined segments, that have not been assigned to a scan chain. These scan segments are located in a segment pool. A broken inferred scan segment represents a sequential element that has been previously identified as part of an inferred scan segment from annotations generated by check test process 220, but the user has subsequently indicated an inconsistent treatment of one or more sequential cells within that inferred segment. A segment can consist of a single sequential cell (e.g., segment size of one). At step 310, analysis system 250 partitions the segments located in step 305 by clock domain for each incompatible clock domain of the current design within 210. The clock domains are defined by the -clock_mixing option of the set_scan_configuration command of the specification process 230. Otherwise incompatible clock domains can be made compatible by the user selecting clock and/or edge mixing. At step 315, on the first pass, process 250A identifies the first incompatible clock domain (e.g., the first incompatible clock domain segment partition block) and accesses all scan chains defined as compatible with that clock domain.

At step 320, if there are no scan chains compatible with the selected clock domain, at step 325 the present invention adds an unused scan chain to the scan plan. An unused scan chain is a chain defined by the user, but with no scan structures allocated to it. If at step 330, it is determined by process 250A that there are no unused scan chains, a new chain with a unique identifier is added to the scan plan at step 335. The negative paths of steps 320 and 330 and the path of step 335 return to step 340 of FIG. 2B.

At step 340 of FIG. 2B, the present invention balances the segments of the selected incompatible clock domain partition block among the identified scan chains of that same clock domain. The subprocess steps of step 340 are described in more detail in FIG. 3A and FIG. 3B. The result of step 340 is a construction, within the scan plan, of the scan chains within the selected clock domain where each scan chain is balanced, e.g., contains substantially equal number of sequential cells. At step 345, process 250A checks if there are more incompatible clock domain partition blocks not yet processed. If so, then the next incompatible clock domain partition block is selected at step 350 and processing returns to step 315 for the newly selected clock domain partition block. If no incompatible clock domain partition blocks remain unprocessed, processing flows to step 353 where specific chain balancing optimization is performed. The subprocesses of step 353 are described with respect to FIG. 2C.

It is appreciated that upon completion of process 250A, the analysis process 250 of system 205 has generated a complete specification ("scan plan") of scan chains within the IC design of database 210 (or any specified current design therein) without altering the logic cells of database 210. The scan plan is stored within a computer readable memory of CAD system 112. The user is given a script 252 and/or a report 254 of the resultant specification according to the exemplary syntax of the above preview_scan command. It is appreciated that circuit details not specified by the user within script 235 are automatically generated by analysis process 250 according to specified default behaviors. It is further appreciated that where the user has specifically defined scan structures, analysis process 250 leaves the details of those scan structures alone and only integrates those scan structures into the complete specification ("scan plan") as needed or instructed.

Figure 2C:
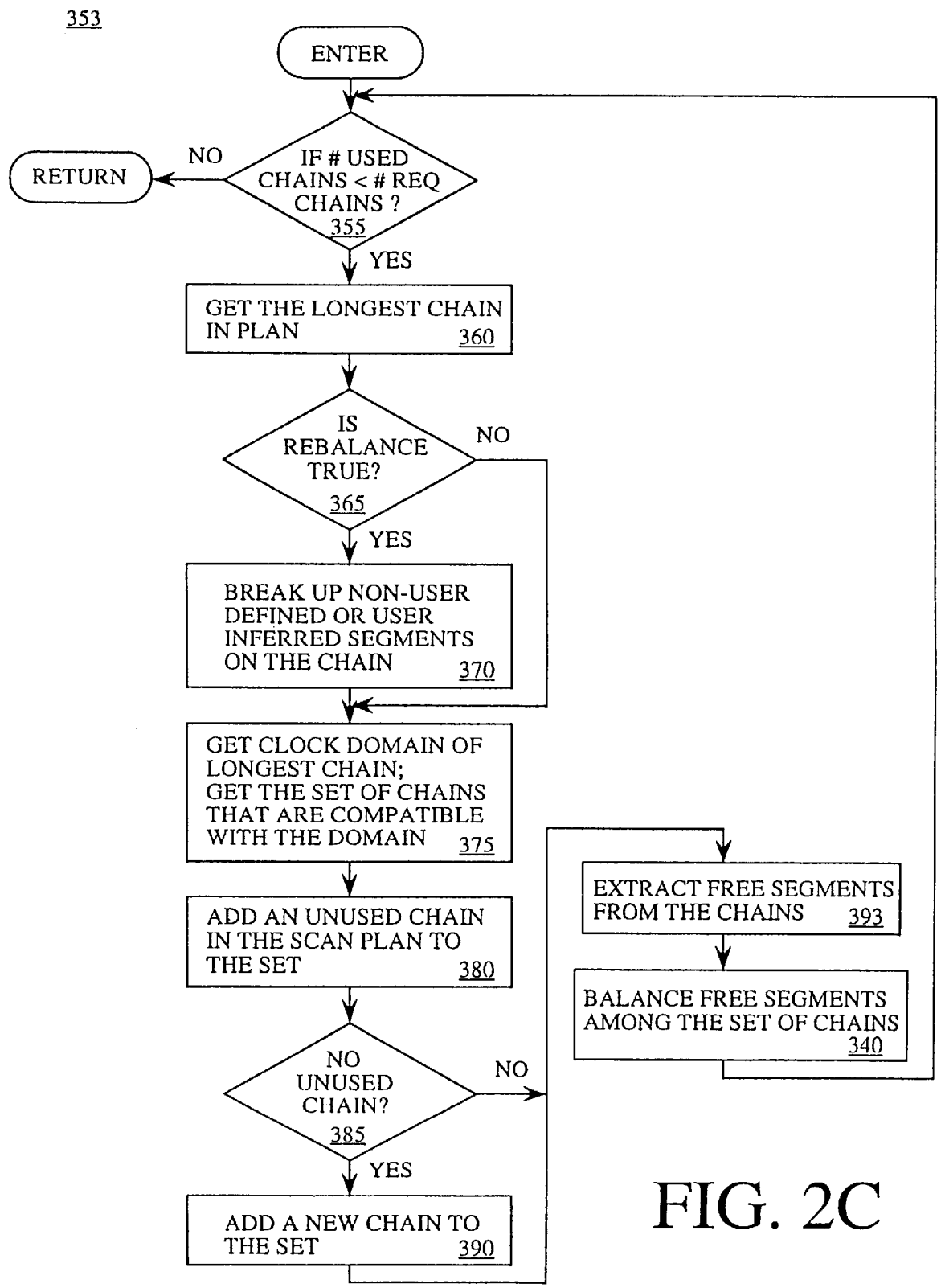
FIG. 2C illustrates process steps performed within the analysis process of the present invention for scan chain balancing optimization.

FIG. 2C illustrates step of process 353 of the analysis process 250 for performing scan chain balancing optimization. According to process 353, if the number of scan chains used in process 250A is less than requested by the user (e.g., in the set_scan_configuration command) then process 353 creates new chains to reduce the length of the longest chain. If the rebalance option of set_scan configuration is set (e.g. true) then process 353 breaks up non-user defined segments on the longest chain. It is appreciated that steps of process 353 are implemented as program instructions or code stored within computer readable memory units of CAD system 112 and executed on processor 101 (FIG. 15).

Process 353 commences at step 355 of FIG. 2C where process 353 checks if the number of scan chains used by process 250A is less than the number of scan chains permitted by the user. If not, processing returns. If so, processing flows to step 360 where process 353 accesses the longest chain in the scan plan. The rebalance option of set_scan_configuration being set to true is checked at step 365, and if so, processing flows to step 370, else, processing flows to step 375. At step 370, the present invention breaks up non-user defined segments or non-user inferred segments in the largest scan chain. In one embodiment, these segments are broken into single sequential cells. It is appreciated that at step 370, the segments of the longest chain are broken, not the chain itself. For instance, a segment A having 100 sequential cells located on the longest chain becomes 100 segments each having one sequential cell each. At step 375, the present invention obtains the clock domain of the longest scan chain and also obtains the set of scan chains that are compatible with this clock domain.

At step 380 of FIG. 2C, the present invention adds an unused scan chain to the scan plan and the set of set chains. Step 385 checks if there are no unused scan chains to use. If so, processing flows to step 390, else, processing flows to step 393. At step 390, a new scan chain with a unique identifier is added to the scan plan and the set of scan chains and processing flows to step 393. At step 393, the present invention extracts all free segments from each chain of the chains. A free segment is a segment that is not user specified to be a member of the chain. Next, step 340 is applied to balance the free segments among the set of chains for this clock domain. Processing then returns to step 355 for further possible optimization.

Figure 3A:
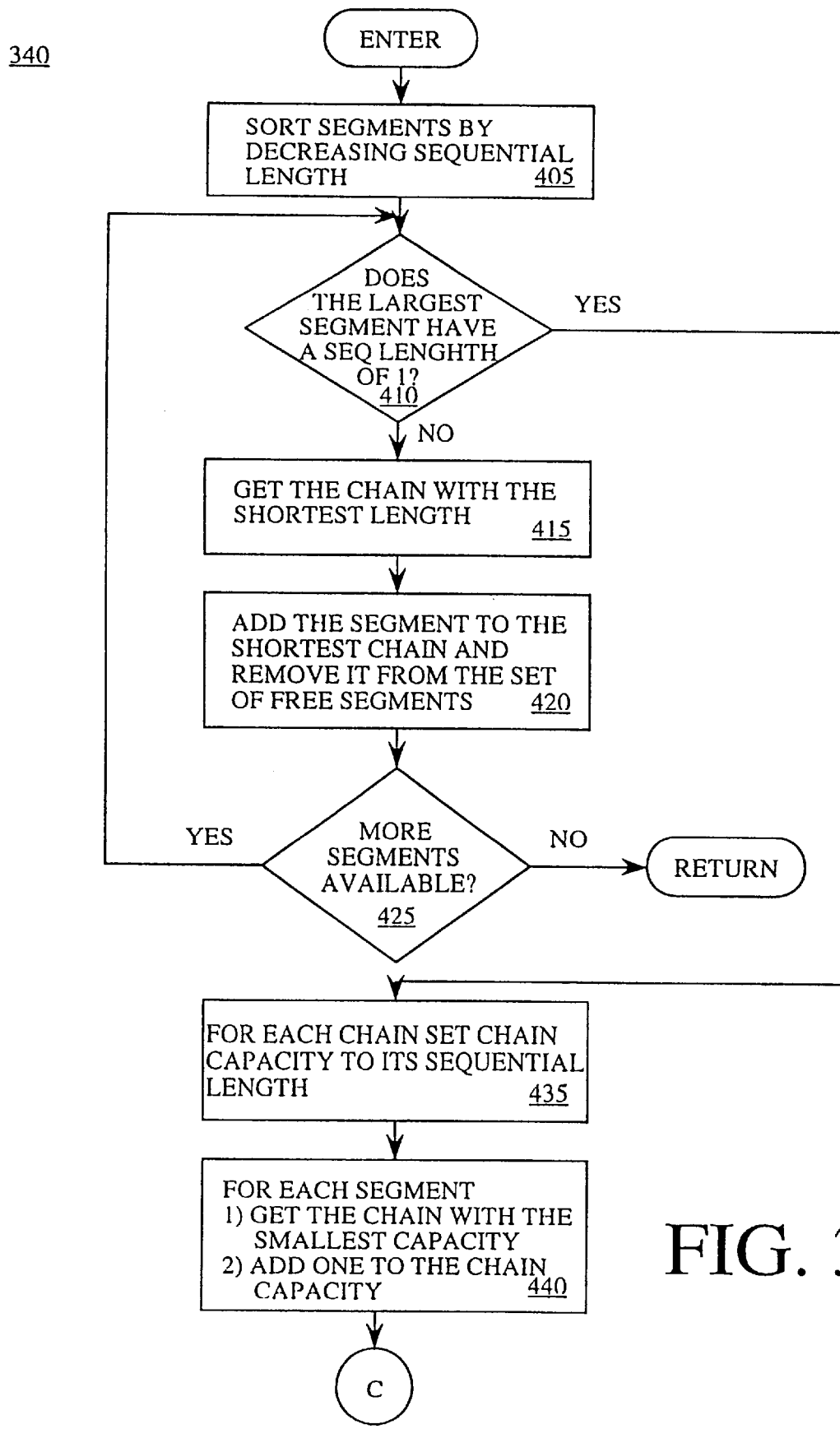
FIG. 3A and FIG. 3B illustrate process steps performed within the analysis process of the present invention for balancing segments among a set of chains.
Figure 3B:
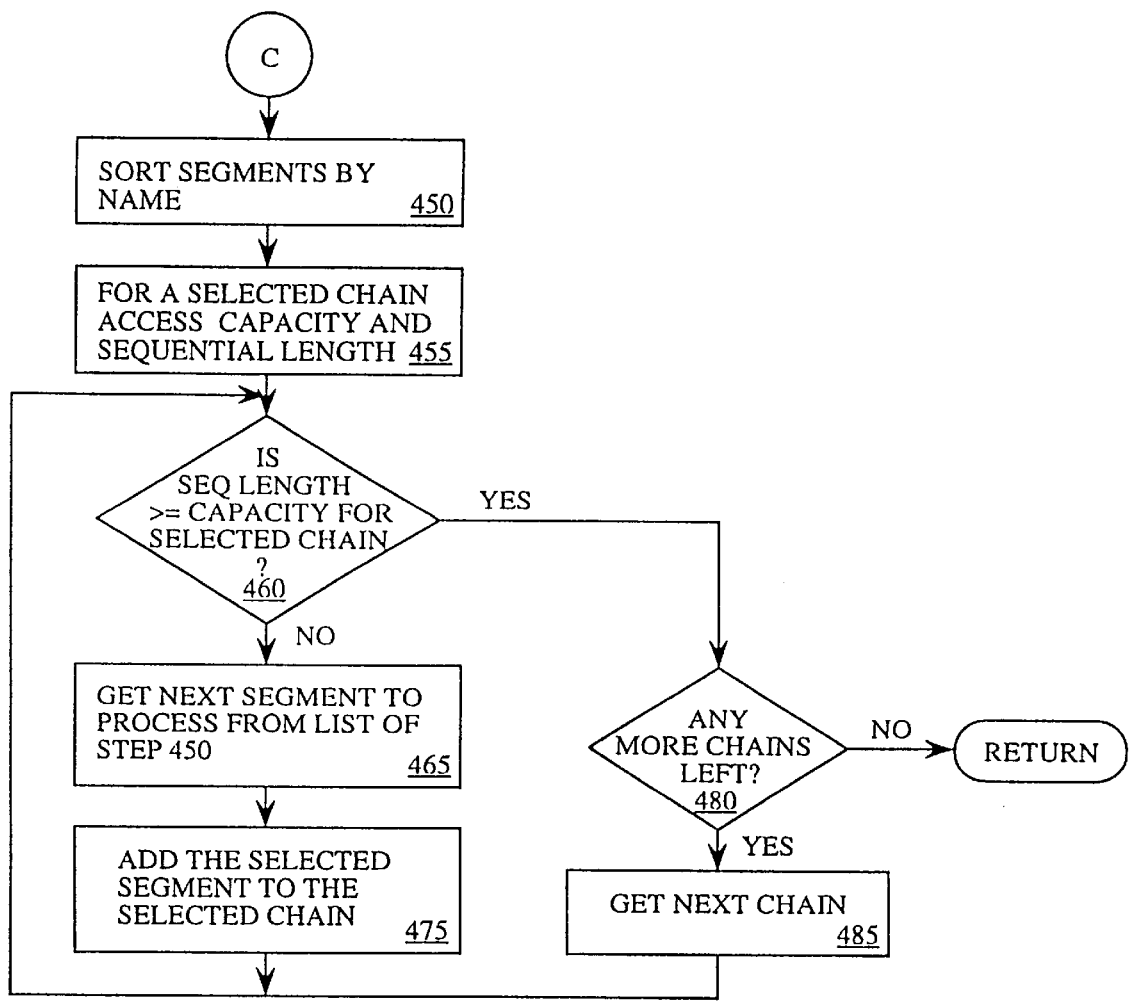

FIG. 3A and FIG. 3B illustrate the steps of process 340 used to balance segments among a set of chains for a particular clock domain. Process 340 is called by process 250A and also by process 353 and supplied with an input domain of a set of scan chains and an input domain of free segments to be balanced among the scan chains. The steps of process 340 are realized as program code or instructions within a computer readable memory unit of CAD system 112 (FIG. 15) and executed on processor 101. At step 405 of FIG. 3A, the present invention sorts the segments of the input domain by decreasing sequential cell length and starts selecting individual segments starting with the one having the largest sequential length. At step 410, the present invention determines if the largest segment has a sequential length of one (e.g., is composed of only one sequential cell). If so, processing flows to step 435, else, processing flows to step 415. At step 415, the present invention accesses the scan chain of the set of scan chains having the shortest length. At step 420, the present invention adds the selected segment to the currently shortest scan chain (as defined by step 415) and removes it from the set of free segments. In this manner, the present invention adds the currently largest unallocated segment to the currently shortest scan chain. This information is stored in the scan plan. Flow then continues to step 425.

At step 425, the present invention checks if there any more unallocated segments available in the input set of segments. If so, the present invention accesses the next largest segment of the input set of segments to be the selected segment and processing returns to step 410. If there are no more unallocated segments at step 425, process 340 exits.

If the largest scan segment has a sequential length of 1 at step 410, processing flows to step 435. At step 435, the remaining segments have sequential length of one. At step 435, for each chain, the present invention defines a chain capacity for the chain and assigns the chain's sequential length to its chain capacity. At step 440, for each segment, the present invention (1) obtains the chain with the smallest chain capacity and (2) adds one to the chain's chain capacity. Processing then flows to step 450 of FIG. 3B where the present invention balances the chains of the input domain while respecting segment names to minimize hierarchical boundary crossings.

Refer to FIG. 3B. At step 450 of FIG. 3B, the present invention sorts the remaining 1 sequential length segments by name to minimize hierarchical boundary crossings. Also at step 450, a selected chain and a selected segment of the remaining segments is determined. At step 455, for the selected scan chain, the present invention obtains 1) the capacity and 2) the sequential length of that scan chain. At step 460, the present invention determines of the sequential length of the chain is greater than or equal to the chain's capacity. If not, processing flows to step 480. If so, processing flows to step 480. If not, processing flows to step 465 where the next unprocessed 1 sequential length segment is accessed from the sorted list of step 450. At step 475, the selected 1 sequential length segment is added to the selected scan chain thereby increasing the scan chain's sequential length. Process flow then returns to step 460.

At step 480 of FIG. 3B, the present invention checks if there are any more chains not processed by step 460. If so, processing flows to step 485 where a next scan chain is selected and processing returns to step 460. If the last scan chain is processed at step 480, process 340 returns. At the completion of process 340, the segments of the input domain have been distributed across the scan chains of the input domain. Segments of sequential length of one are processed last. It is appreciated that as a scan chain is constructed by process 340, the proper scan signals (e.g., scan in, scan out, scan enable) are maintained and/or added and any needed linking element are added by the present invention.

During construction of scan chains in the scan plan, the analysis process 250 inserts lockup latches automatically when a scan chain crosses two clock domains driven by separate clocks and when the user specifies a lockup latch as a scan link (e.g., within a set_scan_path command).

FIG. 4A and FIG. 4B illustrate steps within process 250B that are performed as preprocessing by the analysis system 250 in advance of the balancing steps of process 250A. The steps of process 250B are realized as program code or instructions within a computer readable memory unit of CAD system 112 (FIG. 15) and executed on processor 101.

At step 510 of FIG. 4A, the present invention interrogates the design database 210, ignoring module boundaries and user specifications, and locates all scan cells within database 210 and assigns them as single bit (e.g., base) segments and places the base segments into a segment pool. Step 510 ignores generic cells, cells indicated as not to be scanned (e.g., have scan_element attributes set false), and lockup elements. It is appreciated that all cells, except for the above cells that are ignored, are processed by step 510, even cells that are to be assigned to scan segments. At step 515, the present invention loads all user defined segments (e.g., by the set_scan_segment command) within database 210 and places these user defined segments into the segment pool. For each cell that is assigned to a user defined segment identified in step 515, its corresponding single bit segment is deleted from the segment pool. This is performed for each user defined segment of step 515. In this way, each cell of database 210 is assigned to only one segment within the segment pool.

At step 515, if a user defined segment contains a hierarchical cell (e.g., a hierarchical design), then the hierarchical cell is interrogated to locate all scan structure within it. A list of already processed scan segments is then compiled and compared against the boundary of the hierarchical cell. This comparison is performed to determine if any of the scan segments that have been already identified are wholly contained in the hierarchical cell. If any such scan segments are found, then they are included within the currently processed user defined scan segment and they are subsequently removed from their prior assignment. This function contributes to maintaining a one-to-one correspondence between any given cell and only one associated scan segment. In other words, this function addresses the situation where multiple segments attempt to include the same group of cells through different levels of hierarchical assignment. At the completion of step 515, the cells of each user defined segment are marked as associated with their user defined segment. The segment pool also contains each user defined segment.

Step 520 is then processed where each set_scan_path command is interrogated. The steps within process 520 are shown in more detail in FIG. 4B. The goal of process 520 is to associate segments with particular scan chains as defined by the set_scan_path commands. Ultimately, this results in an indication of which scan segments of the segment pool remain "free," e.g., not associated with any particular scan chain. Also, at the completion of process 520 data structures are defined that indicate which scan structure is associated with which scan chains, as defined by the set_scan_path commands (e.g., elements are associated with chains and chains are associated with elements).

Process 520 of FIG. 4B commences at step 522 where a first set_scan_path command is obtained (e.g., a first chain) and a first element of the first set_scan_path command is obtained. At step 524, if the current element is a scan link, then the present invention annotates the appropriate segment (within the scan chain) with the link information (e.g., scan-in type or scan-out type, etc.). The appropriate segment can be an already encountered segment or a segment that follows subsequent to the processing of the link. At step 524, if the current element is a user defined segment, then the segment will be marked as part of the current scan chain and the current scan chain will be marked as including the user defined segment.

At step 526, if the current element of the current scan chain is a hierarchical cell (e.g., a hierarchical design), then the present invention interrogates the hierarchical design to locate all scan structure located therein including examining the hierarchical cell for design annotations (e.g., from constraint driven scan insertion or from check test 220, etc.) that indicate inferred scan segment(s). At step 526, an inferred scan segment is identified only if: (1) none if its membership are already part of another processed scan chain; (2) none of its membership belong to a user defined scan segment; and (3) none of its membership are associated with a previously processed inferred scan segment. Cells that do not fall into any of the above three categories in an inferred scan segment that is not identified remain broken inferred single bit segments within the segment pool. At step 526, for each identified inferred scan segment, the inferred scan segment is placed within the segment pool and the single bit scan segments that are associated with the member cells of the inferred scan segment are removed from the segment pool. In this way, each cell is to be associated with at most only one scan segment although hierarchical cells (e.g., modules) can be associated with multiple segments. At this point, the segment pool contains single bit segments, user defined segments, and inferred segments, with each cell associated with at most only one scan segment. Also at step 526, for each processed hierarchical cell, all of the other scan segments that are wholly contained within the hierarchical cell are populated in that each situated scan segment is added to the segment pool and removed are the single bit segments that are associated with the member cells of the added scan segment. Each segment and inferred scan segment associated with a particular scan chain is so marked.

At step 528 of FIG. 4B, if the current element of the current scan chain is not a hierarchical cell, then it is a leaf cell (e.g., an ordinary sequential element such as a flip-flop or latch). At step 528, the single bit segment associated with the leaf cell is obtained from the segment pool. At step 528, if the segment pool does not contain the corresponding single bit segment, then the leaf cell specified in the current scan chain can be nonscannable (e.g., indicated to not be scanned by having scan_element attributes set false). If this is the case, an error message is generated for the user. At step 528, if the leaf cell is determined to already be assigned to a previously processed scan chain, then an error is generated for the user indicating the current element is assigned to more than one scan chain; the current specification is then ignored. At step 528, if the leaf cell is found to be already defined in a previously encountered user defined segment, then an error is generated for the user indicating the current element is assigned to another user defined segment; the current specification is then ignored. At step 528, if none of the above error conditions are encountered, the present invention marks the current leaf cell as associated with the current scan chain.

At step 530 of FIG. 4B, the present invention checks if the current element of the current scan chain is a user inferred segment of a hierarchical design. If so, at step 530, the present invention populates all of the scan cells associated with the user inferred segment and identifies the user inferred segment only if: (1) none if its membership are already part of another processed scan chain; (2) none of its membership belong to a user defined scan segment; and (3) none of its membership are associated with a previously processed inferred scan segment. This step is similar to step 526, however the present invention focuses on a particular scan chain within the hierarchical cell (as defined by the user inferred segment) rather than all of the hierarchical cell. At the completion of step 530, the present invention adds the identified user defined segment to the segment pool and removes the single bit segments that are associated with the member cells of the identified user defined segment.

At step 532 of FIG. 4B, if the current element is the last element of the current scan chain processing flows to step 534. If not, the next element is accessed as the current element at step 540 and processing returns to step 524. At step 534, data structures are populated based on the processing performed on the current scan chain. One set of data structures indicates the membership of each scan chain by defining scan chains with their respective membership. Another data structure is maintained wherein the segment of each member of a scan chain is marked with an indicator of its scan chain. Segments of the segment pool not so marked as viewed as "free" because they are not associated with any particular scan chain.

At step 536, if the current scan chain is the last set__scan__path command, then process 520 exists. If not, the next set__scan__path command is accessed at step 538 as the current scan chain and processing returns to step 524.

Referring back to FIG. 4A, step 550 identifies any inferred segments within the database 210 that remain (e.g., that are not defined within a set__scan__path command). To find the inferred scan segments, step 550 starts at the top hierarchical level and proceeds downward through each hierarchical cell looking for scan details (e.g., annotations) that indicate the presence of an inferred scan chain. Within step 550, an inferred scan segment is identified only if:(1) none if its membership are already part of another processed scan chain; (2) none of its membership belong to a user defined scan segment; and (3) none of its membership are associated with a previously processed inferred scan segment. For each identified inferred scan segment, it is placed within the segment pool and the single bit segments that are associated with the membership cells of the identified inferred scan segment are removed from the segment pool. These inferred scan segments can then be used as building blocks for other scan chains. The remaining state of the segment pool is then available for process 250A.

Figure 5:
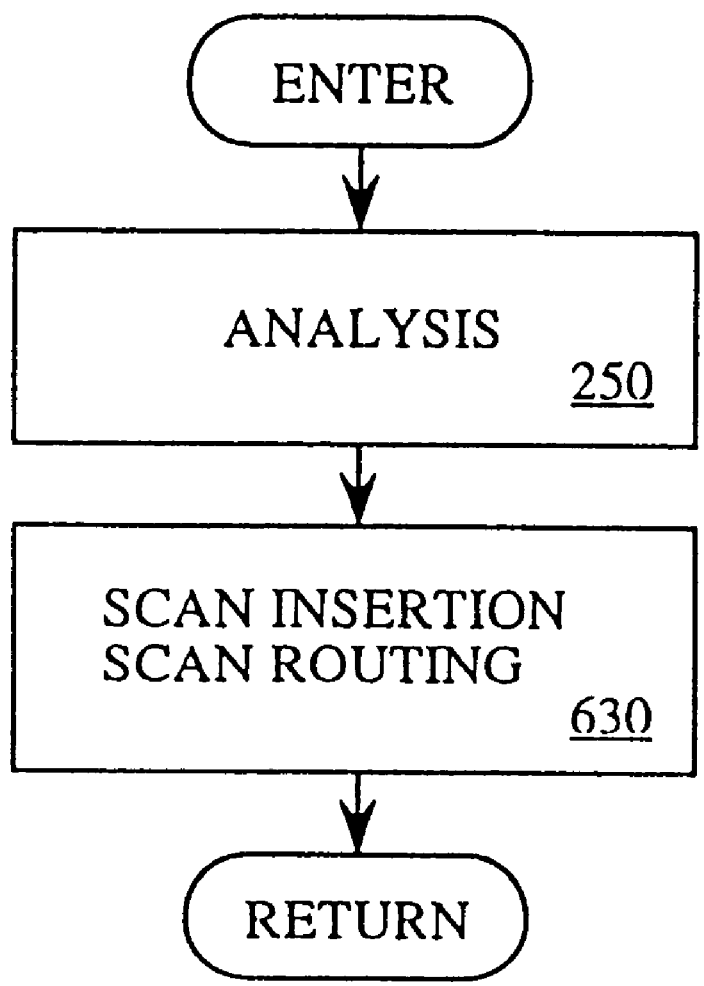
FIG. 5 illustrates process steps within the synthesis process of the present invention.

FIG. 5 illustrates the steps performed by the synthesis process 260 of the present invention. The synthesis process 260 contains analysis step 250 which generates the scan plan for the current design. Subsequent to analysis process 250, synthesis process 260 then executes step 630 which performs scan insertion (e.g., scan replacement) and scan routing. Constraint driven scan insertion can be used for step 630 and is described in detail in application Ser. No. 08/581,187.

Additionally at step 630 of FIG. 5, the following processes are performed in accordance with the present invention. Any cells violated by check test process 220 are deleted by step 630 and warnings are issued to the user. Clock warnings are issued at step 630 (1) if the clock__mixing is set to no__mix and elements on a user segment are clocked by different clocks or different edges of the same clock and (2) if the clock__mixing is set to mix__edges and elements on a user segment are clocked by different clocks. Analogous clock checks and warnings as above are issued for any inferred segments.

VI. Examples—Top Level

The present invention allows users to specify scan chain designs and to implement top-down, bottom-up, and middle-out hierarchical scan insertion methodologies. What follows are sample scenarios using system 205. These scenarios include inserting scan chains from the top-level design down, controlling scan chain routing order inserting scan chains from the bottom-level design up, and reusing existing design structures, such as shift resisters and subdesign scan chains. Section VI contains examples and sample script for inserting scan chains from the top-level, controlling scan chain routing order, and inserting scan chains from the bottom-level. All the sample scenarios described in this section use the multiplexed flip-flop scan style. However, the techniques illustrated apply to all scan styles supported by system 205.

Inserting scan chains from the top-level design down is one way to perform scan insertion for designs with no existing scan structures within subdesigns. With top-down scan insertion, the user executes the specification 230, analysis 250 and synthesis 260 processes only from the top level of the design 210. The user does not perform any separate scan synthesis operations on subdesigns (modules). The advantages of top-down scan insertion include: (1) simplicity because the user need to write only one short script and (2) balanced scan chains because system 205 can readily balance scan chains because it does not have to accommodate existing scan chains within subdesigns.

Figure 6A:
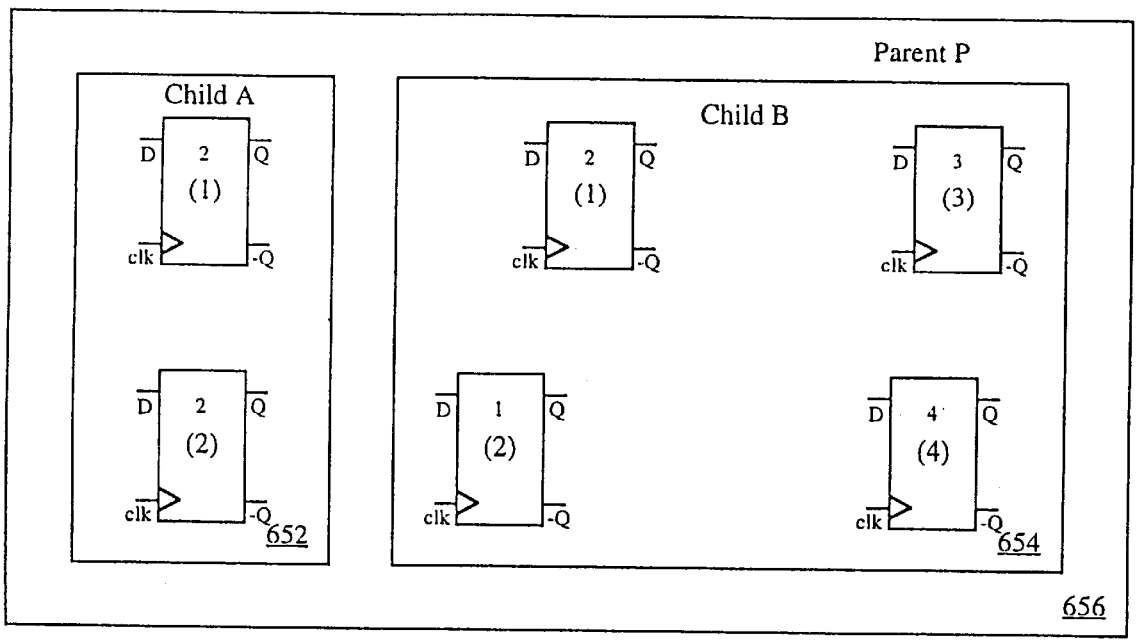
FIG. 6A and FIG. 6B illustrate an example input design database and an example implemented scan structure for a single clock domain design with two chains specified.
Figure 6B:
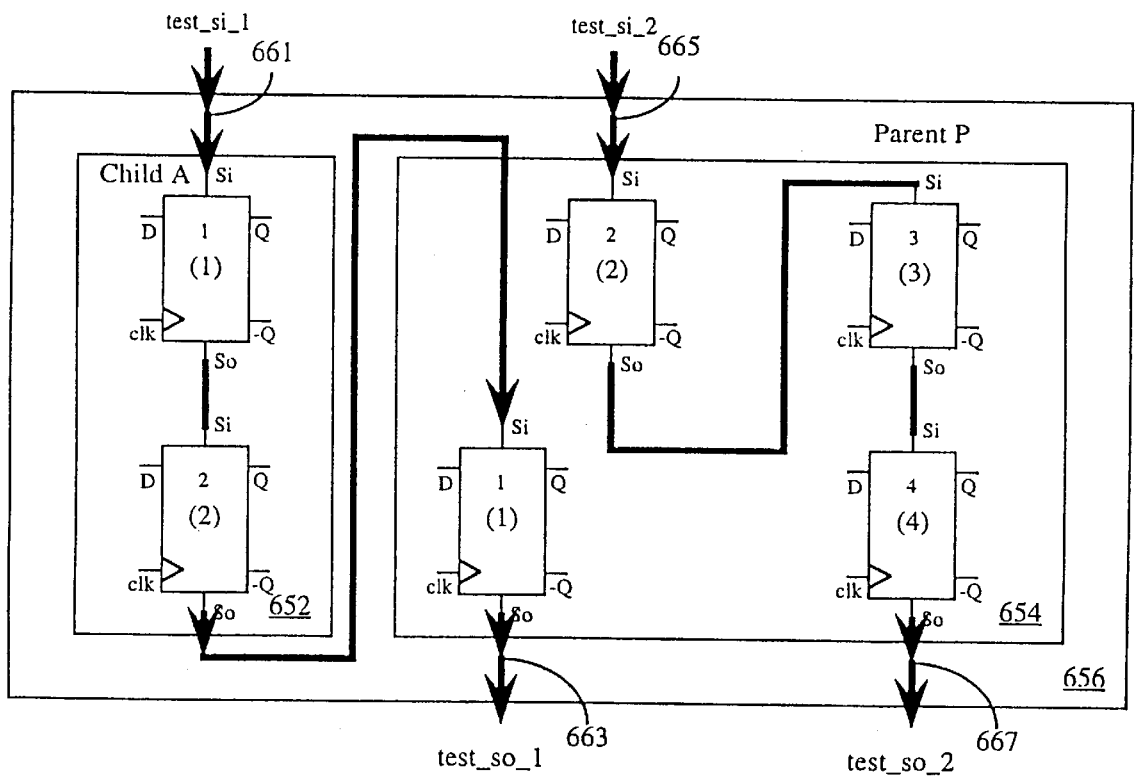

FIG. 6A and FIG. 6B illustrate an example specification having a single clock domain with two scan chains specified and minimal user specifications. The design includes a parent design (P) 656 having a child A 652 with two sequential cells 652(1)–(2) and a child B 654 with four sequential cells 654(1)–(4). FIG. 6A illustrates the design with two chains specified before synthesis process 260 and FIG. 6B illustrates the same domain following synthesis process 260. The user script 235 associated with this example is presented below:

current__design=P
set__scan__configuration-chain__count 2
check test
preview__scan
insert__scan
check test
report__test-scan__path FIG. 6B illustrates the two scan chains system 205 creates, each balanced. One scan chain commences at 661 (scan-in) and ends at 663 (scan-out) while the second scan chain commences at 665 (scan-in) and ends at 667 (scan out). The design shown in FIG. 6B contains all scan elements in a single clock domain. System 205 balances by allocating each chain with three cells and ordering them alphanumerically. The resulting scan architecture:

Scan chain '1': test__si__1 (661), childA/1, childA/2, childB/1, test__so__1 (663)

Scan chain '2': test_si_2 (665), childB/2, childB/3, childB/4, test_so_2 (667)

Figure 7A:
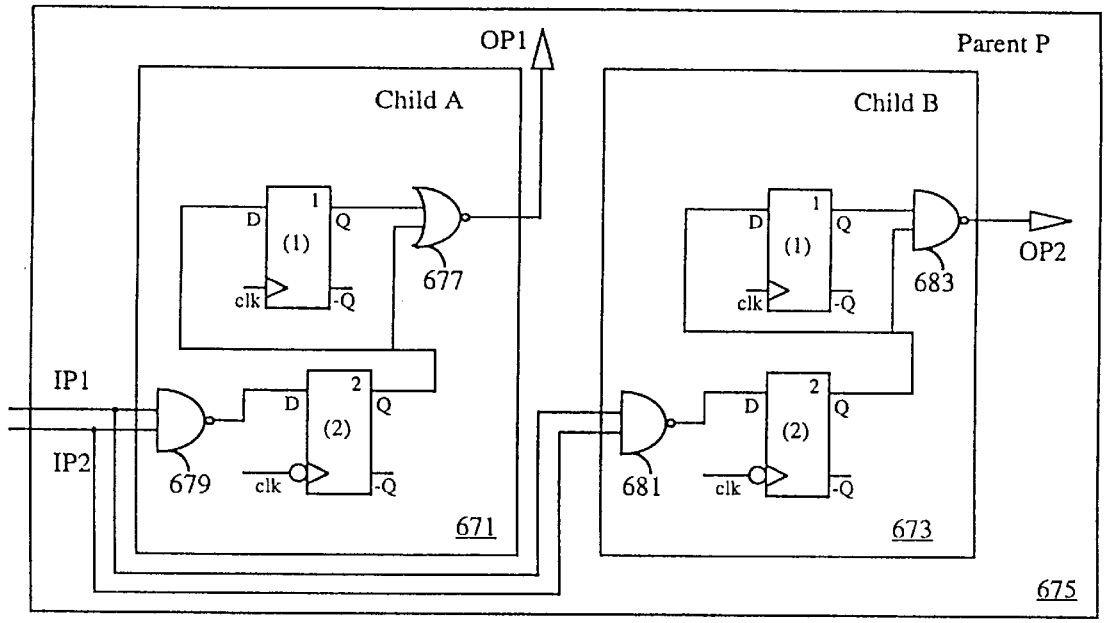
FIG. 7A and FIG. 7B illustrate an example input design database and an example implemented scan structure for a mixed clock edge design.
Figure 7B:
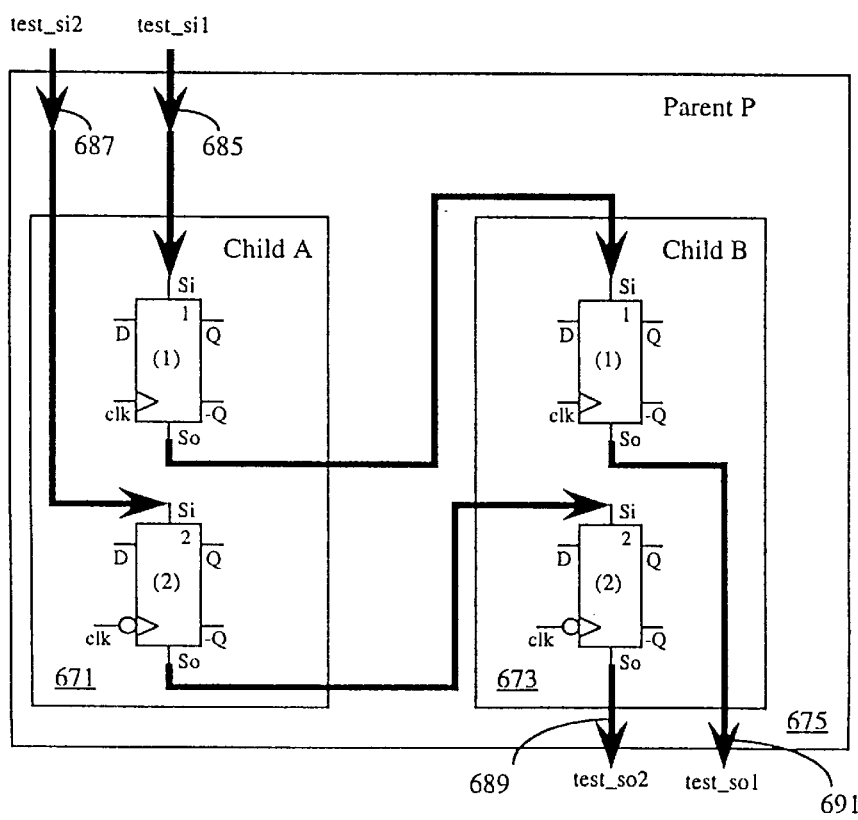

FIG. 7A and FIG. 7B illustrate an example specification having a mixed clock edge design with minimal user specifications. Parent module P 675 contains child A module 671 and child B module 673. Child A 671 contains flip flops 671(1)–(2) and logic gates 679 and 677 and child B 673 contains flip flops 673(1)–(2) and logic gates 681 and 683 coupled as shown. FIG. 7A illustrates the design before Child A 671 contains flip flops 671(1)–(2) and logic gates 679 and 677 and FIG. 7B illustrates the same design after synthesis process 260. The user script 235 associated with this example is presented below:

current_design=P
create_test_clock CLK-waveformn {45 55}
check test
preview_scan
insert_scan
check test
report_test-scan_path The above script explicitly declares a clock to make it clear which clock waveforms are being used. System 205 places scan cells clocked on different edges of the same clock in different clock domains. As a result, system 205 produces two scan chains by default as shown in FIG. 7B. The user could place all sequential cells in the same chain if the configuration allowed mixing of clock edges. The resulting scan architecture is shown below:

Scan chain '1': test_si_1 (685), childA/1, childB/1, test_so_1 (691)
Scan chain '2': test_si_2 (687), childA/2, childB/2, test_so_2 (689)

Figure 8A:
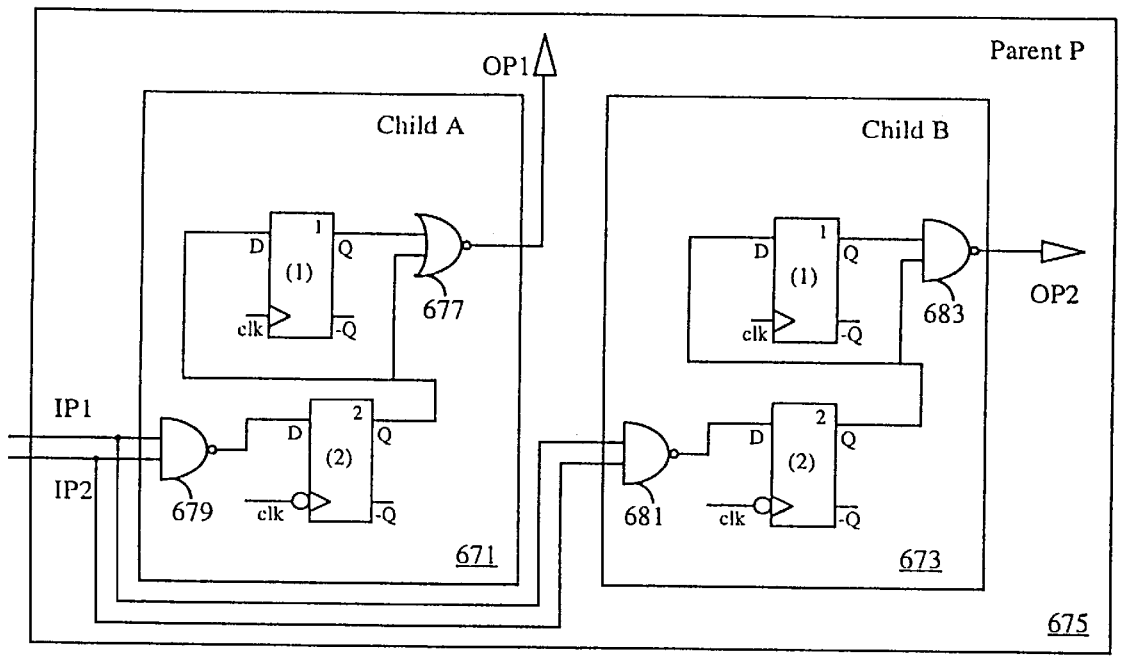
FIG. 8A and FIG. 8B illustrate an example input design database and an example implemented scan structure for a mixed clock edge design with edge mixing allowed.
Figure 8B:
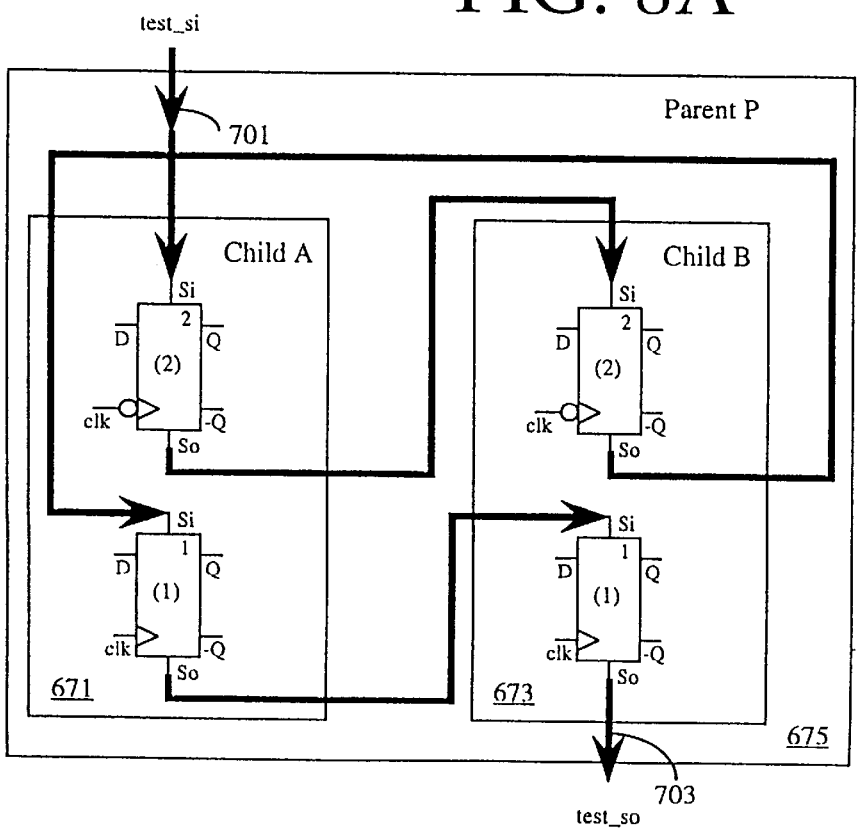

FIG. 8A and FIG. 8B illustrate an example specification having a mixed clock edge design with minimal user specifications and having the set_scan_configuration-clock_mixing mix_edges option allowed. Parent module P 675 contains child A module 671 and child B module 673. Child A 671 contains flip flops 671(1)–(2) and logic gates 679 and 677 and child B 673 contains flip flops 673(1)–(2) and logic gates 681 and 683 coupled as shown. FIG. 8A illustrates the design before Child A 671 contains flip flops 671(1)–(2) and logic gates 679 and 677 and FIG. 8B illustrates the same design after synthesis process 260. The user script 235 associated with this example is presented below:

current_design=P
set_scan_configuration-clock_mixing mix_edges
create_test_clock CLK-waveform {45 55}
check test
preview_scan
insert_scan
check test
report_test-scan_path System 205 places the early clocked elements after the late clocked elements in the scan chain so that the chain operates correctly. In this case the default alphanumeric ordering is bypassed to create a functional scan chain for the return-to-zero clock timings. The chain exits and then returns to the same module. System 205 considers the timing of the clock waveform to determine which elements are early clocked and which are late clocked. The resulting scan architecture is shown below:

Scan chain '1': test_si (701, childA/2, childB/2, childA/1, childB/1, test_so (703)

Figure 9A:
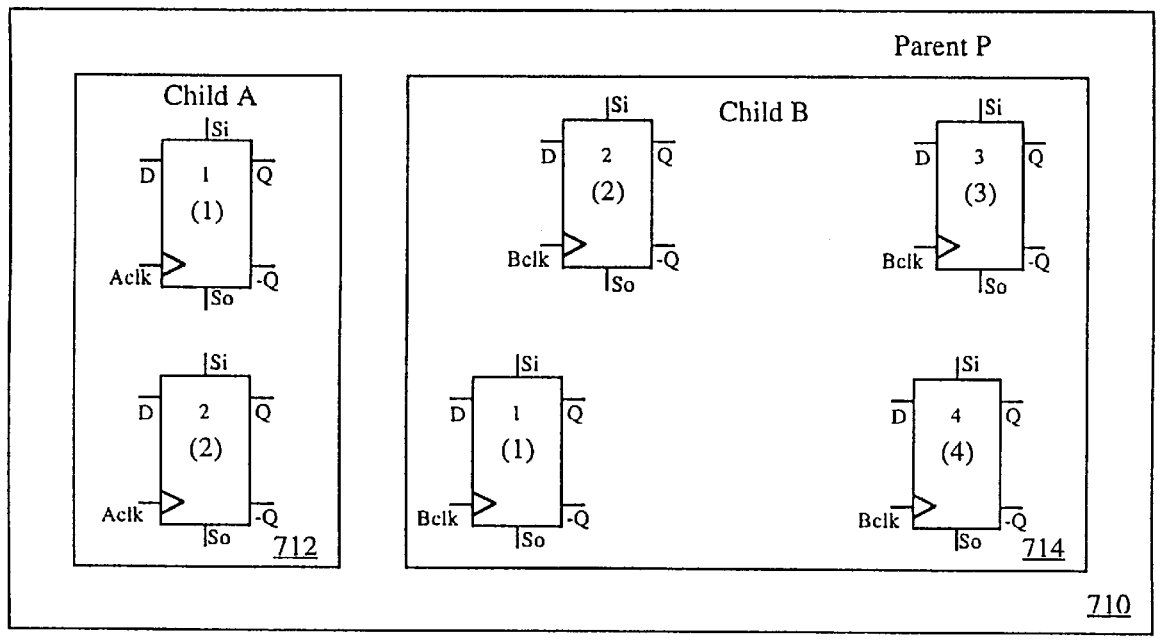
FIG. 9A and FIG. 9B illustrate an example input design database and an example implemented scan structure for a multiple clock domain design.
Figure 9B:
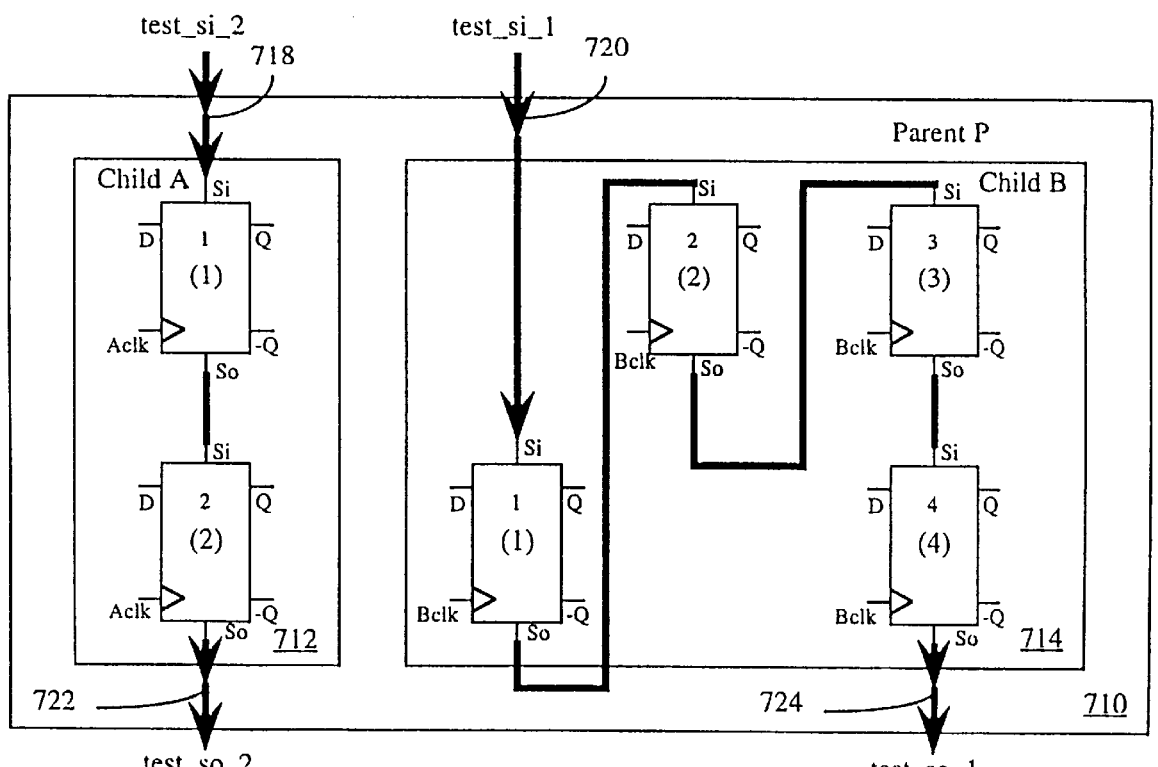

FIG. 9A and FIG. 9B illustrates a case having minimal scan specifications with multiple clock domains. FIG. 9A illustrates the design before synthesis process 260. The parent design 710 contains a child A 712 having two flip flops 712(1)–(2) and a child B 714 having four flip flops 714(1)–(4). The user script 235 for this example is shown below which declares two clock to make it clear which clock waveforms are being used:

current_design=P
create_test_clock Aclk-waveform {45 55}
create_test_clock Bclk-waveform {45 55}
check test
preview_scan
insert_scan
check test
report_test-scan_path As shown by FIG. 9B (post synthesis 260), system 205 generates two scan chains, although the user did not specify two chains, because two clock domains were specified. A first chain exists within child B 714 and the second within Child A 712. By default, clock mixing of domains is now allowed. The resulting scan architecture is shown below:

Scan chain '1': test_si_1 (720), childB/1, childB/2, childB/3, childB/4, test_so_1 (724)
Scan chain '2': test_si_2 718, childA/1, childA/2, test_so_2 (722)

Figure 10A:
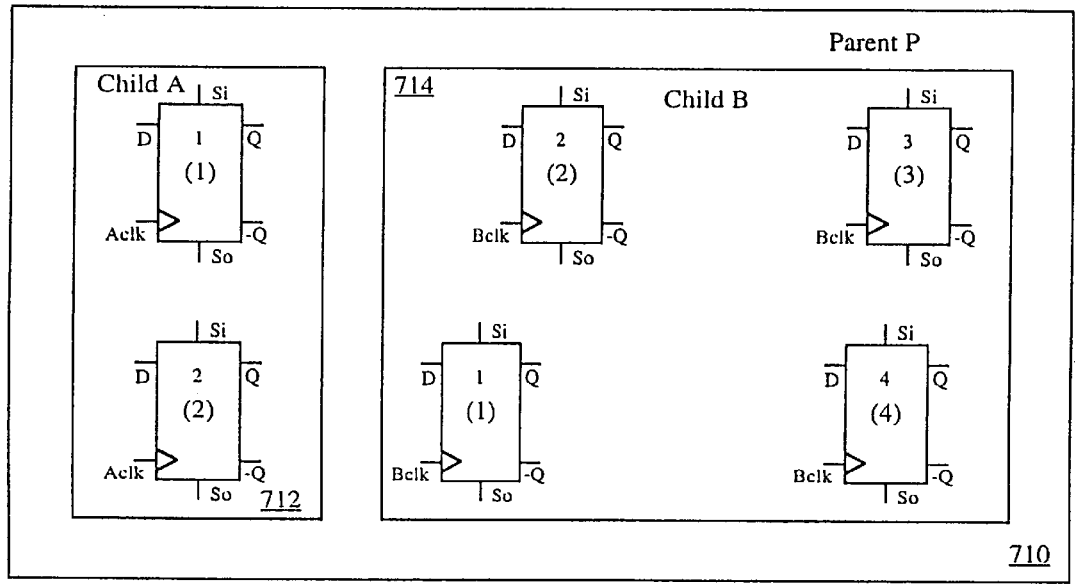
FIG. 10A and FIG. 10B illustrate an example input design database and an example implemented scan structure for a multiple clock domain design with clock mixing and lock-up latches inserted.
Figure 10B:
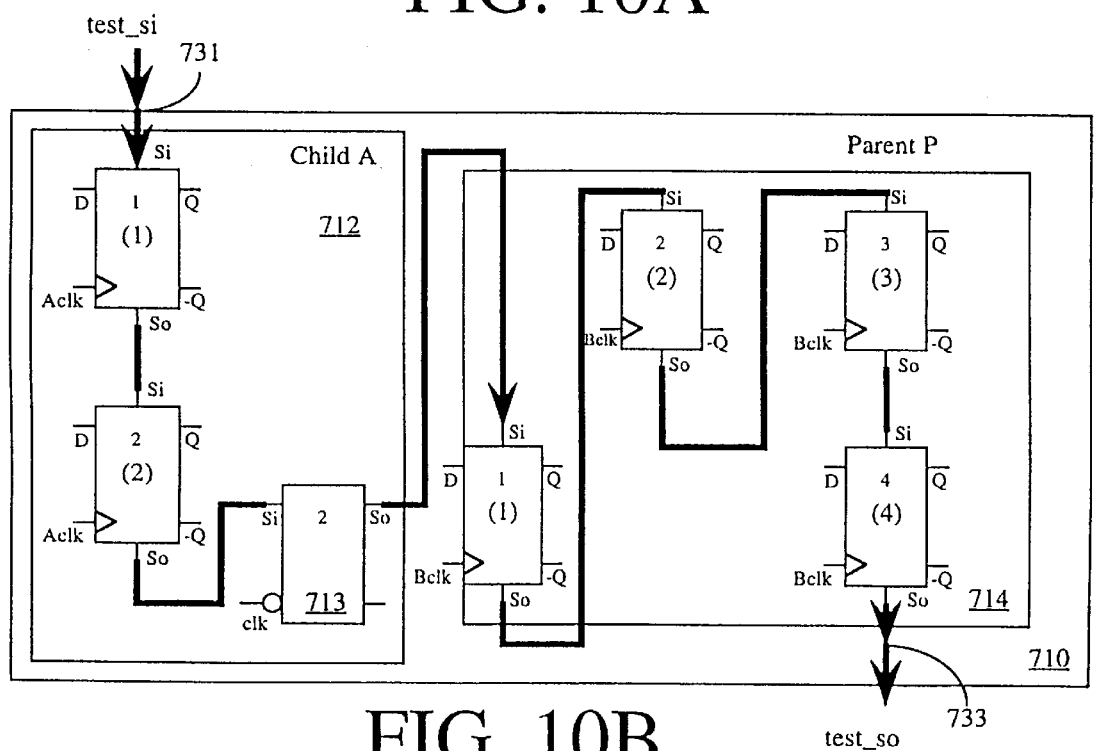

FIG. 10A and FIG. 10B illustrate an example with multiple clocks in the design, with clock mixing and lock-up latches inserted. FIG. 10A illustrates the same design as shown in FIG. 9A. The user script 235 for this example is shown below which declares two clock to make it clear which clock waveforms are being used:

current_design=P
set_scan_configuration-clock mixing mix_clocks
create_test_clock Aclk-waveform {45 55}
create_test_clock Bclk-waveform {45 55}
check test
preview_scan
insert_scan
check test
report_test-scan_path The default behavior of lock-up latch insertion is enabled in the above script. FIG. 10B illustrates the design of FIG. 10A after synthesis process 260. The scan-out lock-up latch 713 is inserted by system 205 at the same hierarchical level 712 as the scan element 712(2) with which the lock-up latch is associated. The resulting scan architecture is shown below:

Scan chain '1': test_si (731), childA/1, childA/2, childB/1, childB/2, childB/3, childB/4, test_so (733)

VII. Examples—Scan Chain Routing Order

The present invention allows the user to control the routing order of elements within the scan chains. Users specify the scan order; in one embodiment, system 205 does not use placement information to determine the optimum scan ordering. The following examples illustrate the use of the set scan_path_command, of editing an analysis process 250 generated script 254, and of using the set_scan_link command by specifying scan-out lock-up latches.

Figure 11A:
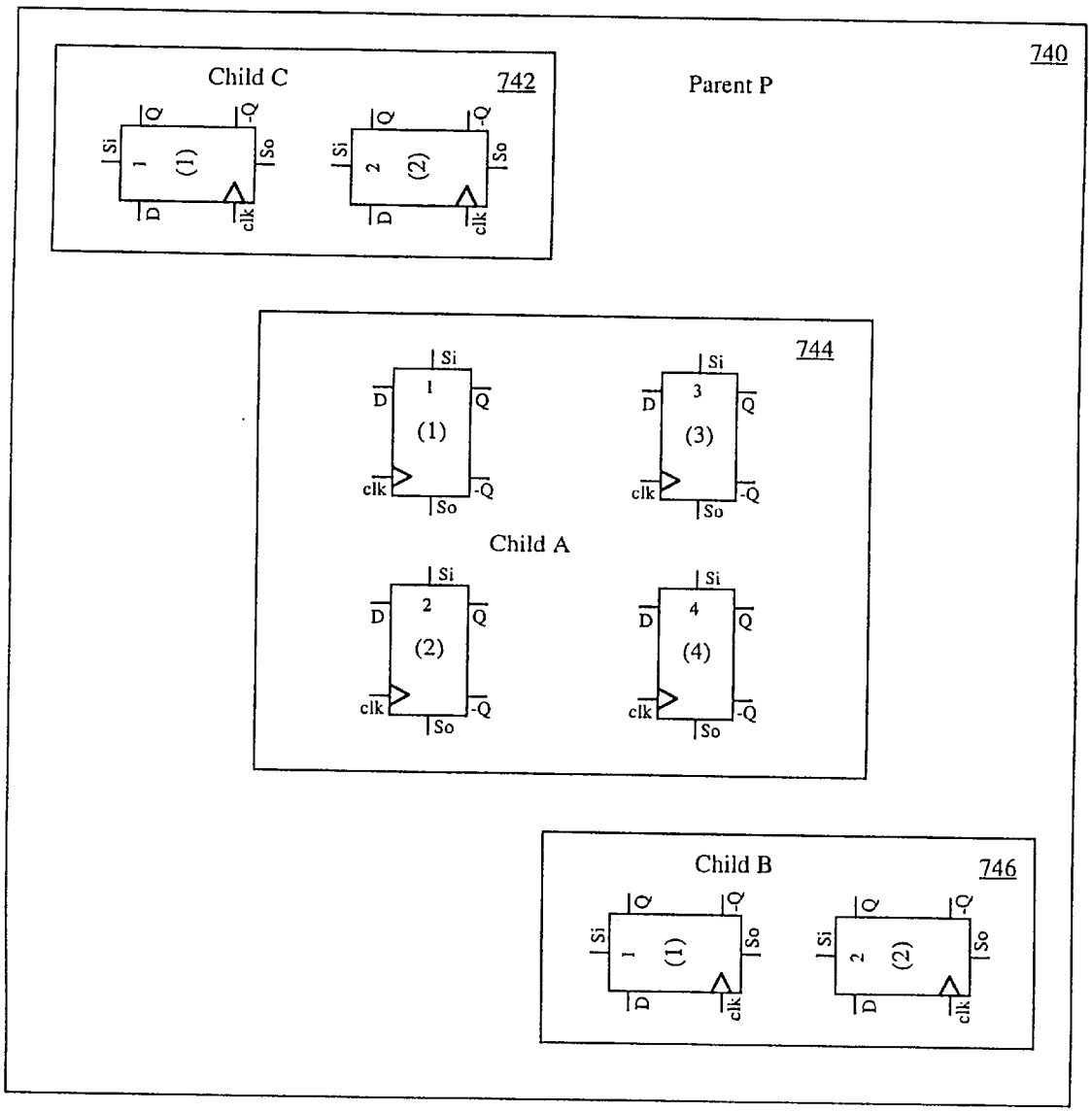
FIG. 11A and FIG. 11B illustrate an example input design database having three modules and a partial specification of scan ordering before scan insertion.
Figure 11B:
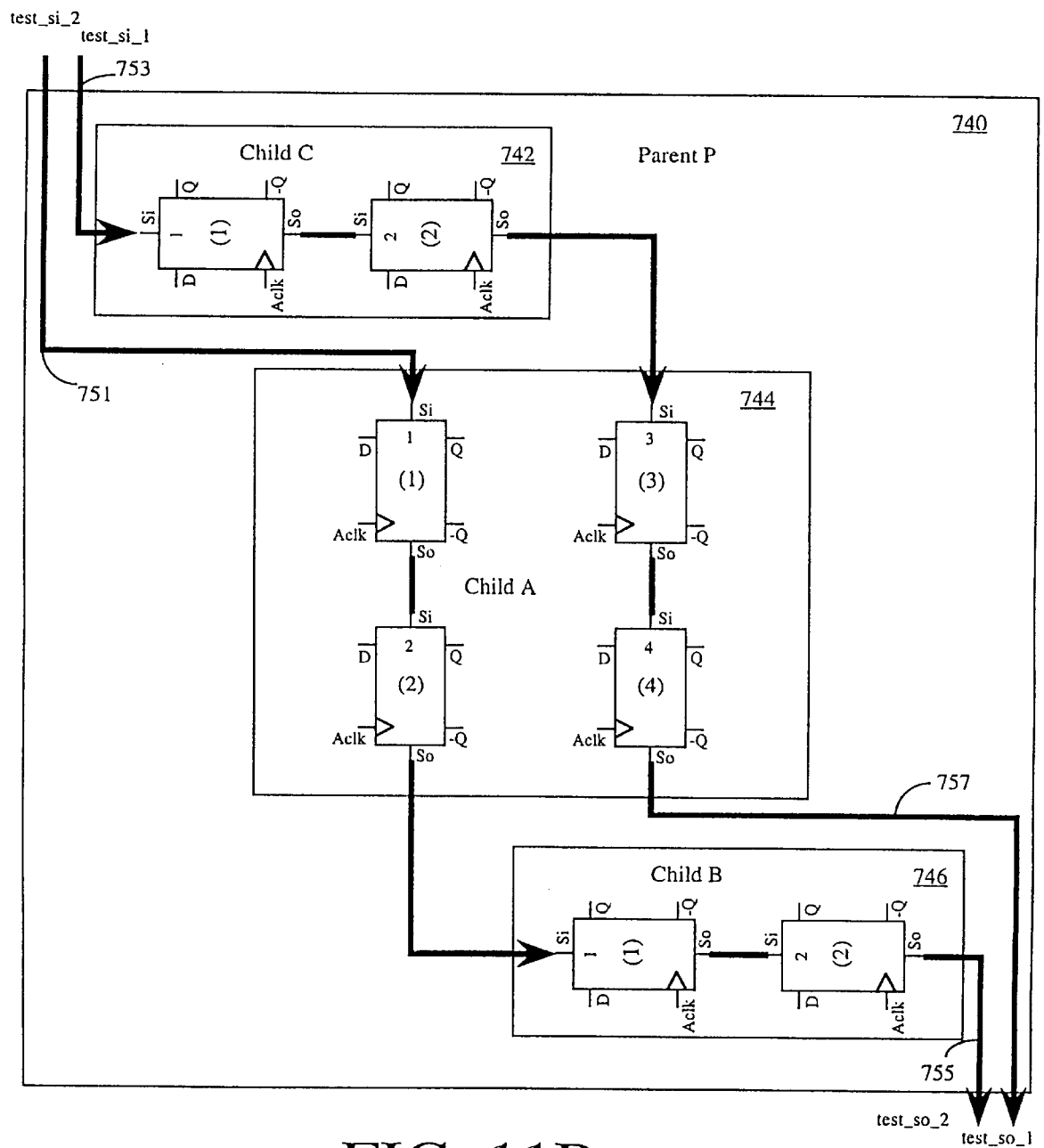

FIG. 11A illustrates a design having a parent design 740 containing child C 742, child A 744 and child B 746 modules. The user specifies two chains and that the scan cells in child C 742 precede scan cells 744(3) and 744(4) of child A for one chain. FIG. 11A illustrates the state before synthesis process 260. The user script 235 for this example is shown below:

current_design=P
 set_scan_configuration-chain_count 2
 set_scanerpath_scan1 {childC, childA/3, childA/4}
 check test
 preview_scan
 insert_scan
 check test
 report_test-scan_path The above script defines the scan ordering for one scan chain. System 205 determines the order for the second scan chain. The script does not specify that the scan |scan path is complete, therefore, system 205 adds extra elements to this scan chain if the extra elements create a more balanced scan architecture. The design contains eight scan elements to be assigned to two chains, so no extra elements needed to be added in this example. FIG. 11B illustrates the resulting architected scan chains after synthesis 260. The resulting scan architecture is shown below:

Scan chain '1': test_si_1 (753), childC/1, childC/2, childA/3, childA/4, test_so_1 (757)
 Scan chain '2': test_si_2 (751), childA/1, childA/2, childB/1, childB/2, test_so_2 (755)

The following example refers to the design of FIG. 11A, however the user specification script 235 completely defines the scan chains:

current_design=P
 set_scan_configuration-chain_count 2
 set_scan_path_scan1 {childC/1, childC/2, childA/3, childA/4}
 set_scan_path scan2 {childA/1, childA/2, childB/1, childB/2}
 check test
 preview_scan
 insert_scan
 check test
 report_test-scan_path In this script, the user explicitly declared the scan ordering for all elements on both chains. The ordering for scan2 matches the default ordering, so the above script produces the same results as shown in FIG. 11B.

The following example refers to FIG. 11A and FIG. 11B and illustrates editing an analysis process 250 generates script 254. The following is an example user script 235:

current_design=P
 set_scan_configuration-chain count 2
 check test
 preview_scan-script>default.scr Analysis process 250 generates the following script 254 based on the above script 235:

| Created by Analysis Process 250 |
|---|
| set_scan_path 1 - dedicated_scan_out false {\ <br> childA/1 \ <br> childA/2 \ <br> childA/3 \ <br> childA/4 \ <br>} |

| -continued |
|---|
| set_scan_path 2 - dedicated_scan_out false {\ <br> childB/1 \ <br> childB/2 \ <br> childC/1 \ <br> childC/2 \ <br>} |

The user able to edit the above script 254 to generate a new user script 235 which is shown below:

| Created by Analysis Process 250 and edited by the user |
|---|
| set_scan_path 1 - dedicated_scan_out false {\ <br> childC/1 \ <br> childC/2 \ <br> childA/3 \ <br> childA/4 \ <br>} <br> set_scan_path 2 - dedicated_scan_out false {\ <br> childA/1 \ <br> childA/2 \ <br> childB/1 \ <br> childB/2 \ <br>} |

The above script is edited by the user to implement a non-default scan ordering.

VIII. Examples—Inserting Chains from Bottom Level

System 205 supports inserting scan chains from the bottom design level up by allowing the user to execute the specification 230, analysis 250, and synthesis 260 processes at the module level. The user can then repeat this process at higher levels of the design 210. The advantages of bottom-up scan insertion include: (1) reducing the risk of lengthy scan synthesis runtimes; and (2) identifying problems associated with the scan insertion early in the design flow. Bottom-up scan insertion requires more complex scan insertion scripts over top-down scan insertion. The following examples illustrates the use of the set_scan_configuration command. With this command, the user can control the number of scan chains in a design 210.

Figure 12A:
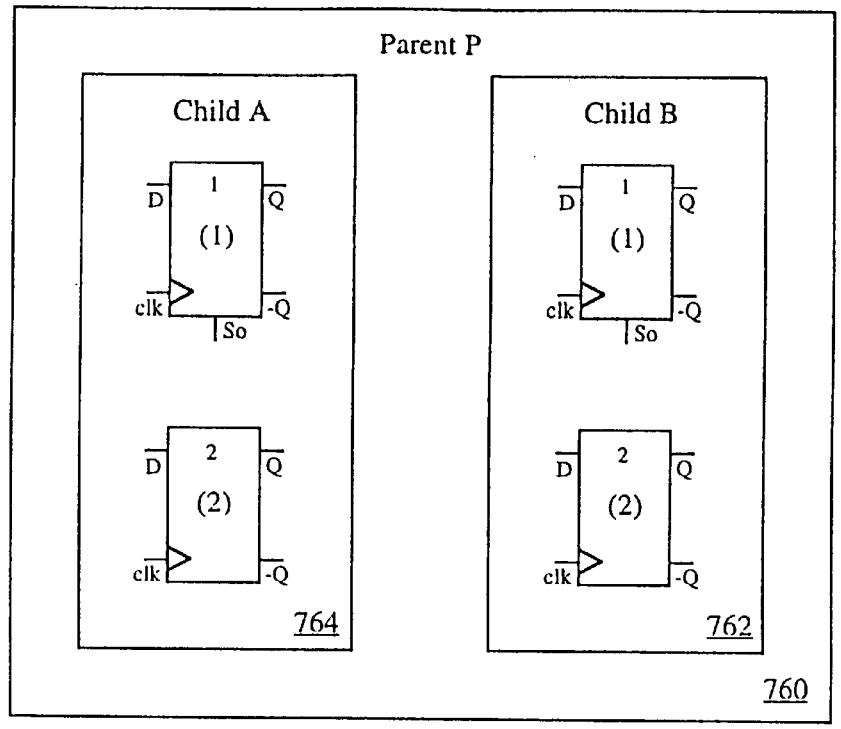
FIG. 12A illustrates a design with a single clock domain with minimal scan before scan insertion.
Figure 12B:
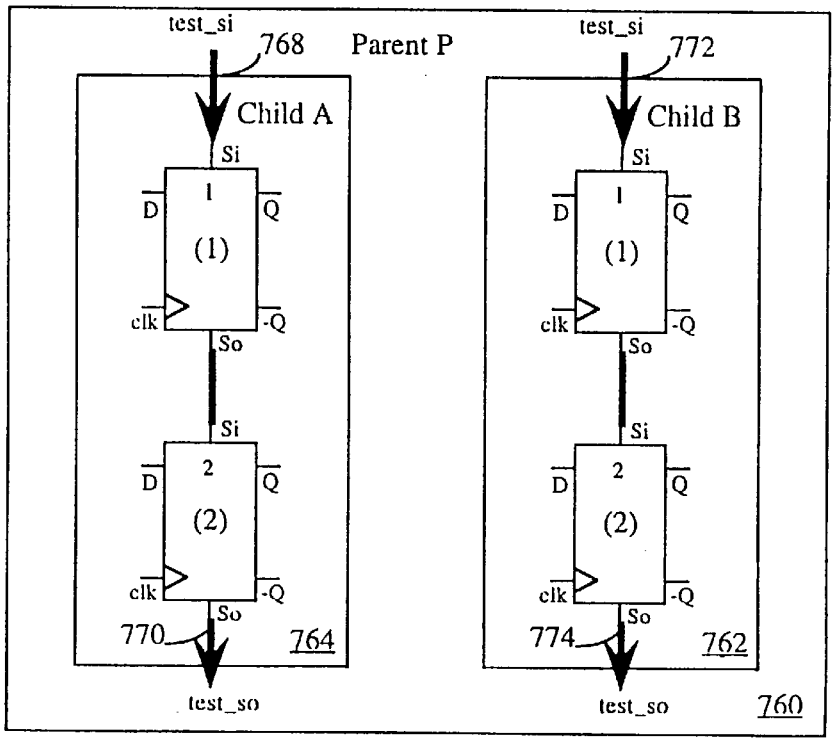
FIG. 12B illustrates the scan insertion of the design of FIG. 12A at the module level and FIG. 12C illustrates the scan insertion of the design of FIG. 12A at the top level.
Figure 12C:
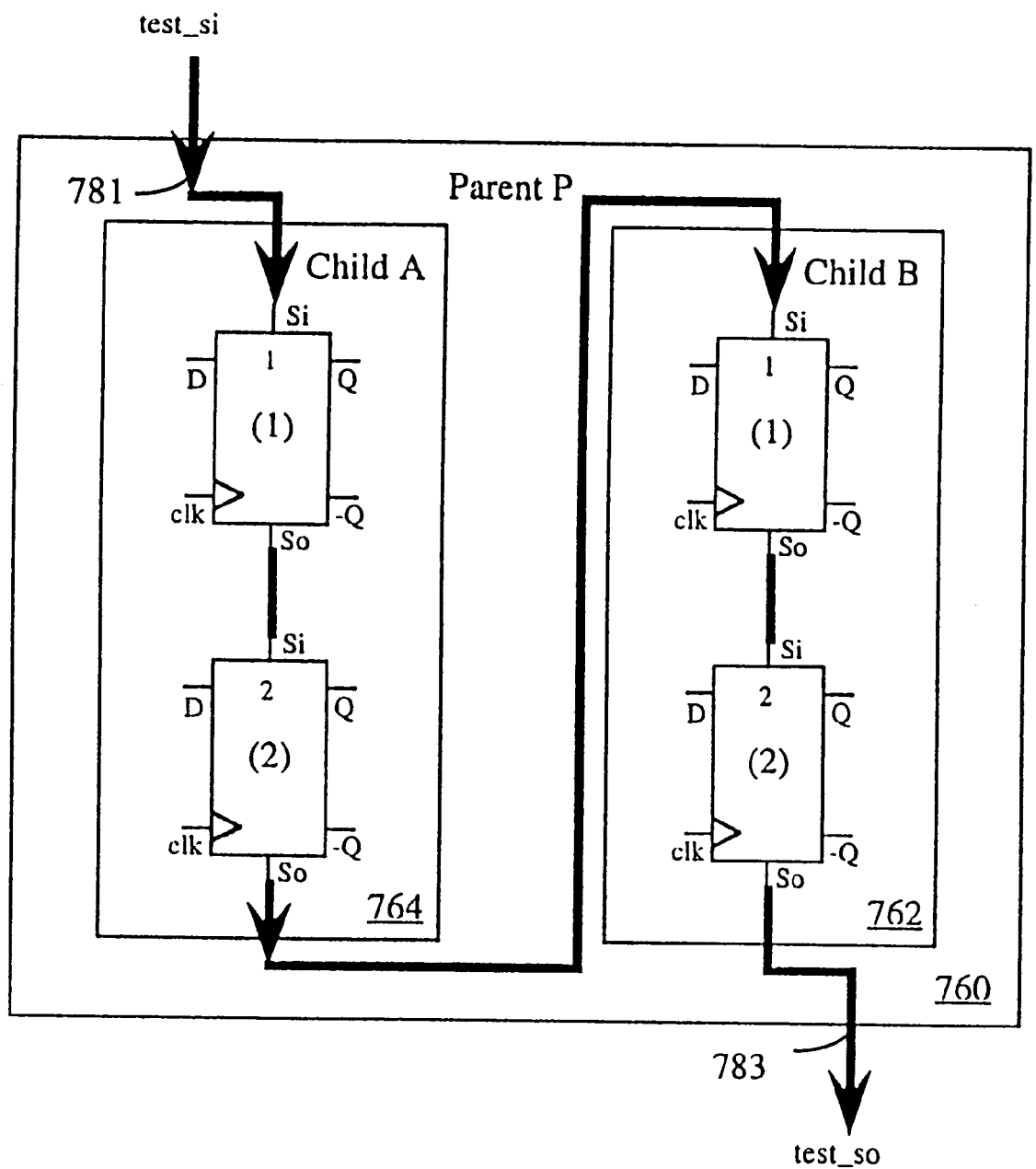

The following examples illustrates the manner in which system 205 processes using bottom-up scan insertion a design with a single clock domain with minimal user specification. FIG. 12A illustrates a parent design P 760 that includes a child module A 764, containing flip flops 764(1)–(2), and a child module B 762, containing flip flops 762(1)–(2). In this example, the user desires to insert a single scan chain into module A 764 and a single scan chain into module B 762. When the scan chains are inserted, the user then creates a single scan chain at the top level of the design. FIG. 12A illustrates the state of the design before synthesis process 260 is invoked. The user script 235 for this example is shown below:

current_design=P
 check test
 current_design=A (childA)
 check test
 preview_scan
 insert_scan
 current_design=B (childB)
 check test
 preview_scan
 insert_scan The result of the above script generates the scan architecture of FIG. 12B (post synthesis 260) where child A module 764 contains a scan chain commencing at 768 (scan in) and ending at 770 (scan out) and child B 762 contains a scan chain commencing at 772 and ending at 774. The methodology signals are only connected to the child design ports. In complex designs, there can be multiple instances of the subdesign (e.g., module A). In these cases, synthesis 260 has, processed each instance the same way. The user can specify different scan architectures for same named modules by (1) uniquifying the named modules to create multiple subdesigns or (2) setting the current design to top so the user can express the different scan architectures using the hierarchical instances of subdesign A in the set_scan_path commands. The present example also contains the following additions to the above script 235:

current_design=P
    check test
    preview_scan
    insert_scan
    check test
    report_test-scan_path The result of the above script generates the scan architecture of FIG. 12C where a single scan chain exists commencing at 781 and ending at 783. The single scan chain couples the two scan chains of child A 764 and child B 762 and provides scan ports for primary input/output to the complete chain.

Figure 13A:
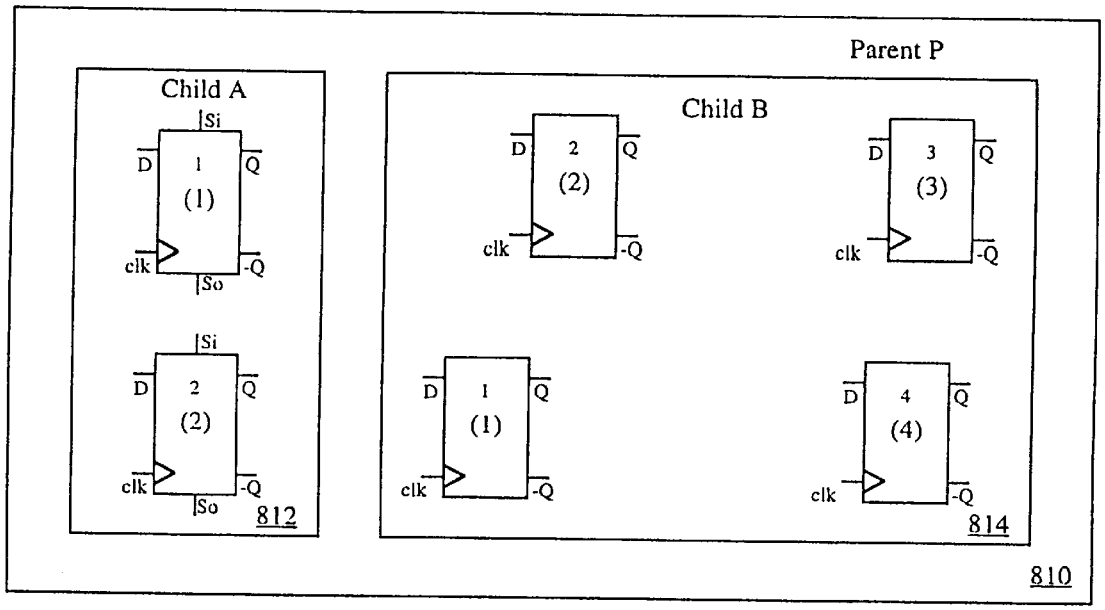
FIG. 13A and FIG. 13B illustrate an example input design database and an example implemented scan structure for a single clock domain design with two scan chains specified at the top level.
Figure 13B:
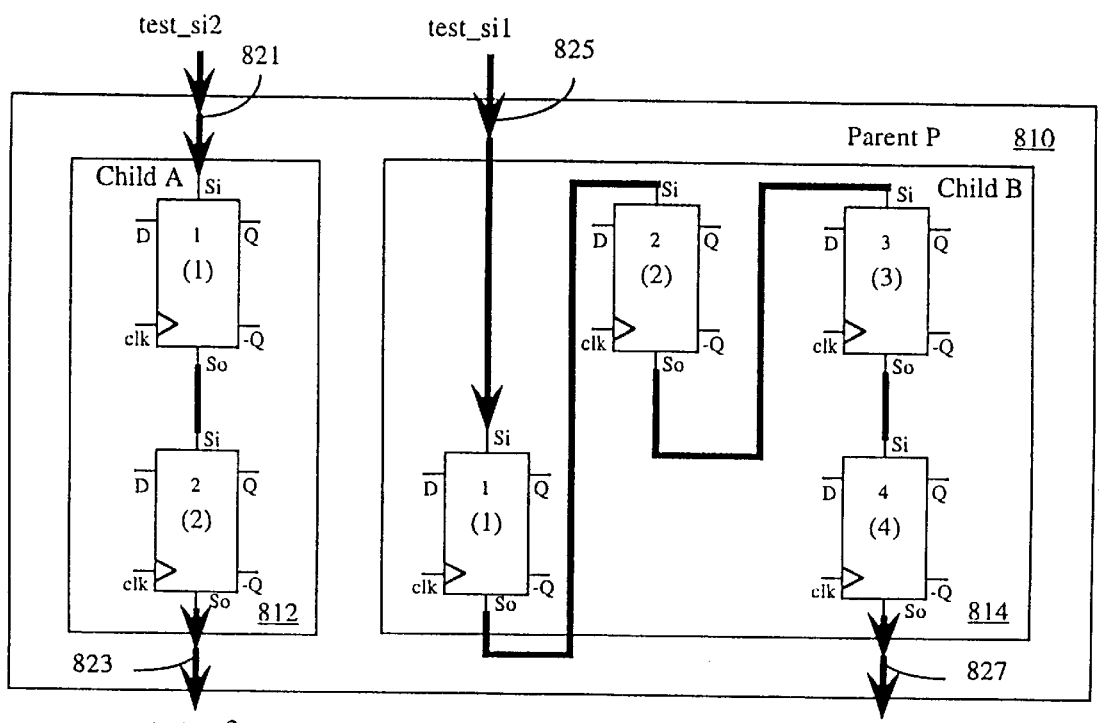

FIG. 13A and FIG. 13B illustrates an example where system 205 supports creating a single scan chain within each child module and then creates two parallel chains at the top level. FIG. 13A illustrates the design in advance of invoking synthesis process 260. The parent 810 contains child A module 812 having two flip flops 812(1)–(2) and child B module 814 containing four flip flops 814(1)–(4). The present example utilizes the below user script 235:

current_design=P
    check test
    current_design=A (childA)
    check test
    preview_scan
    insert_scan
    current_design=B (childB)
    check test
    preview_scan
    insert_scan
    current_design=P
    set_scan_configuration-chain_count 2
    check test
    preview_scan
    insert_scan
    check test
    report_test-scan_path The above script explicitly instructs system 205 to use two scan chains at the top level of the design. Where the number of scan chains is explicitly requested, system 205 balances the scan configuration with this constraint. FIG. 13B illustrates the resultant scan architecture after synthesis process 260 has executed. In this example, a single clock group contains all scan elements. By default, synthesis process 260 does not re-architect existing scan chains. As a result, it is unable to balance the scan chains in this example. One chain commencing at 821 and ending at 823 contains two cells while the second chain commencing at 825 and ending at 827 contains four cells. To balance these chains, the user needs to set the set_scan_configuration rebalance option to true (see below).

Figure 14A:
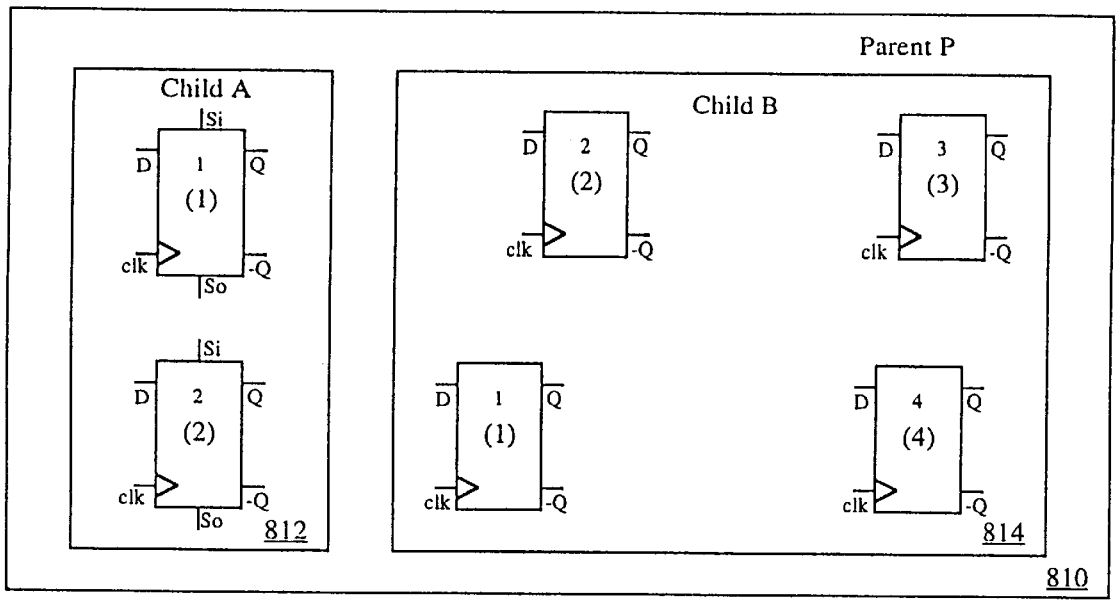
FIG. 14A and FIG. 14B illustrate an example input design database and an example implemented scan structure for a single clock domain design with the rebalance option set.
Figure 14B:
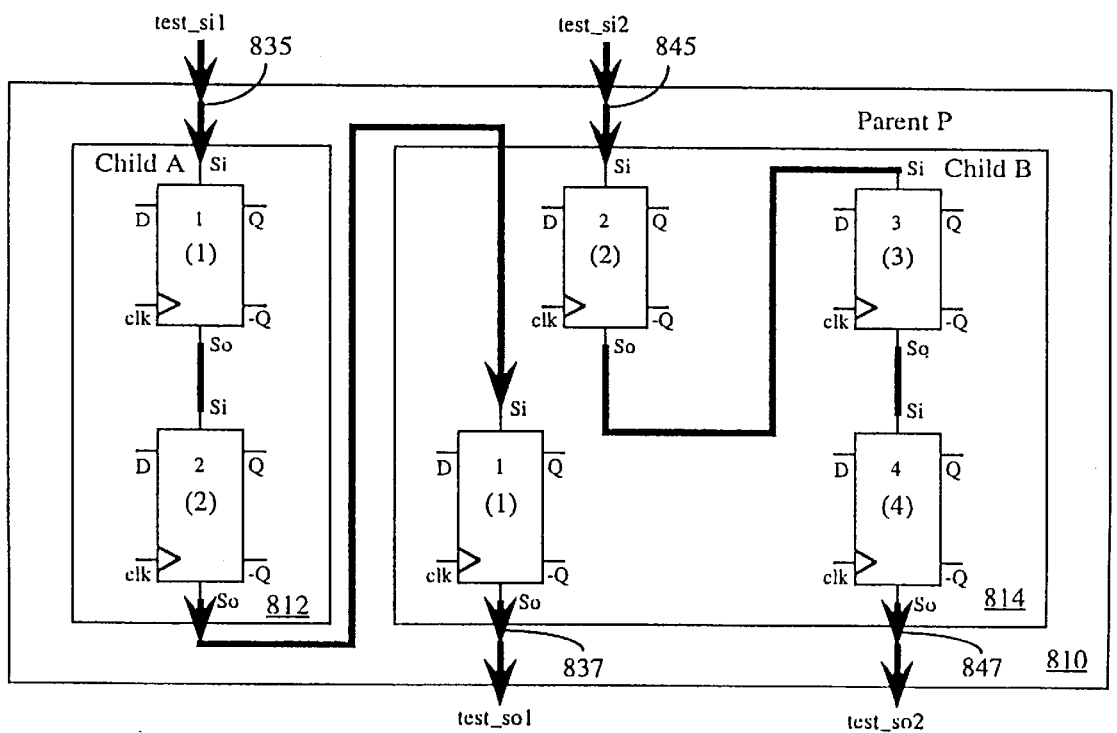

The following example illustrates the creation by system 205 of a single scan chain with each child module and system 205 then creating two balanced parallel chains at the top level. FIG. 14A illustrates a parent design 810 having child module A 812 with two cells 812(1)–(2) and child module B 814 with four cells 814(1)–(4) before invoking the synthesis process 260. The present example utilizes the below user script 235:

current_design=P
    check test
    current_design=A (chldA)
    check test
    preview_scan
    insert_scan
    current design=B (childB)
    check test
    preview_scan
    insert_scan
    current_design=P
    set_scan_configuration-chain_count 2-rebalance true
    check test
    preview_scan
    insert_scan
    check test
    report_test-scan_path The resultant scan architecture is illustrated in FIG. 14B after synthesis 260. Two scan chains exist each having three cells each. The first chain commences at 835 and ends at 837, the second chain commences at 845 and ends at 847. Setting-rebalance true in this script causes synthesis process 260 to balance the scan configuration by re-architecting the scan chain in the child B module 814. Within each chain, the elements remain in alphanumeric order. The resultant scan architecture is shown below:

Scan chain '1': test_si_1 (835), childA/1, childA/2, childB/1, test_so_1 (837)

Scan chain '2': test_si_2 (845), childB/2, childB/3, childB/4 test_so_2 (847)

In the above example, synthesis process 260 moves flip flop childB/1 814(1) from scan chain 1 to scan chain 2 to create a balanced arrangement since the rebalance option is true.

IX. Conclusion

The preferred embodiment of the present invention, a system and method for providing design for test resources (scan chains) within an integrated circuit design which can include hierarchical subdesigns, is thus described. While the present invention has been described in particular embodiments, it should be appreciated that the present invention should not be construed as limited by such embodiments, but rather construed according to the below claims.

What is claimed is:

1. A computer readable medium containing instructions that when executed implement a method of inserting scan resources into an integrated circuit design, said method comprising the steps of:

a) accessing user defined specification commands defining scan configurations that indicate a manner in which scan chains are to be constructed and define scan structures to be used in constructing said scan chains;

b) generating a scan plan based on said design and based on said specification commands without altering logic within said design, said step b) further comprising the steps of:
- b1) partially constructing scan chains within said scan plan according to said specification commands;
- b2) identifying scan structure within said design not covered by said specification commands; and
- b3) completely constructing said scan chains within said scan plan based on said scan structure identified in steps b1) and b2) to generate balanced scan chains; and c) synthesizing said scan plan within said design by inserting scan resources into said design to realize said balanced scan chains, said step c) storing information in computer memory for use by a computer system in the production of an integrated circuit device of said integrated circuit design.

2. A computer readable medium as described in claim 1 wherein said step b) of said method further comprises the step of generating a report of scan resources to be constructed within said design based on said scan plan.

3. A computer readable medium as described in claim 1 wherein said method further comprises the step of d) generating a report indicating existing scan resources within said design.

4. A computer readable medium as described in claim 1 wherein said step b3) of said method further comprises the steps of:
integrating scan structure identified in step b2) within partially constructed scan chains of step b1); and
constructing additional scan chains composed of said scan structure identified in step b2).

5. A computer readable medium as described in claim 1 wherein said step a) of said method further comprises the step of receiving a specification command defining a scan segment, said scan segment including a member list of sequentially coupled scan cells and access points to said member list, said access points including a scan in and scan out.

6. A computer readable medium as described in claim 1 wherein said step a) of said method further comprises the step of receiving a specification command defining a scan path, said scan path including a list of scan structures to be linked together by step b) and by step c) to form a scan chain of said scan structures.

7. A computer readable medium as described in claim 1 wherein said step a) of said method further comprises the step of receiving a specification command defining a scan configuration, said scan configuration including a number of said scan chains to be constructed by said step b) and by said step c) and further including an indication of whether or not clock domain mixing is allowed by said step b) and by said step c) in constructing said balanced scan chains.

8. A computer readable medium containing instructions that when executed implement a method of inserting scan resources into an integrated circuit design, said method comprising the steps of:
a) accessing user defined specification commands defining scan configurations that indicate a manner in which scan chains are to be constructed and define scan structures to be used in constructing said scan chains, wherein said specification commands include a specification command defining a scan segment, said scan segment including a member list of sequentially coupled scan cells and access points to said member list, said access points including a scan in and scan out;

b) generating a scan plan based on said design and based on said specification commands without altering logic within said design, said step b) further comprising the steps of:
- b1) partially constructing scan chains within said scan plan according to said specification commands;
- b2) identifying scan structure within said design not covered by said specification commands; and
- b3) completely constructing said scan chains within said scan plan based on said scan structure identified in steps b1) and b2) to generate balanced scan chains; and c) synthesizing said scan plan within said design by inserting scan resources into said design to realize said balanced scan chains, said step c) storing information in computer memory for use by a computer system in the production of an integrated circuit device of said integrated circuit design.

9. A computer readable medium as described in claim 8 wherein said step b) of said method further comprises the step of generating a report of scan resources to be constructed within said design based on said scan plan.

10. A computer readable medium as described in claim 9 wherein said method further comprises the step of d) generating a report indicating existing scan resources within said design.

11. A computer readable medium as described in claim 8 wherein said step b3) of said method further comprises the steps of:
integrating scan structure identified in step b2) within partially constructed scan chains of step b1); and
constructing additional scan chains composed of said scan structure identified in step b2).

12. A computer readable medium as described in claim 8 wherein said step a) of said method further comprises the step of receiving a specification command defining a scan path, said scan path including a list of scan structures to be linked together by step b) and by step c) to form a scan chain of said scan structures.

13. A computer readable medium as described in claim 12 wherein said step a) of said method further comprises the step of receiving a specification command defining a scan configuration, said scan configuration including a number of said scan chains to be constructed by said step b) and by said step c) and further including an indication of whether or not clock domain mixing is allowed by said step b) and by said step c) in constructing said balanced scan chains.

14. An apparatus for inserting scan resources into an integrated circuit design comprising:
a) means for accessing user defined specification commands defining scan configurations that indicate a manner in which scan chains are to be constructed and define scan structures to be used in constructing said scan chains;

b) means for generating a scan plan based on said design and based on said specification commands without altering logic within said design, said means for generating a scan plan comprising:
b1) means for partially constructing scan chains within said scan plan according to said specification commands;
b2) means for identifying scan structure within said design not covered by said specification commands; and
b3) means for completely constructing said scan chains within said scan plan based on said scan structure identified in said means for partially constructing and said means for identifying scan structure to generate balanced scan chains; and c) means for synthesizing said scan plan within said design by inserting scan resources into said design to realize said balanced scan chains, said means for synthesizing also for storing information in computer memory for use by a computer system in the production of an integrated circuit device of said integrated circuit design.

15. An apparatus as described in claim 14 wherein said means for generating a scan plan further comprises means for generating a report of scan resources to be constructed within said design based on said scan plan.

16. An apparatus as described in claim 15 and further comprising means for generating a report indicating existing scan resources within said design.

17. An apparatus as described in claim 14 wherein said means for completely constructing said scan chains comprises:

means for integrating scan structure identified in said means for identifying scan structure within partially constructed scan chains of said means for partially constructing scan chains; and means for constructing additional scan chains composed of said scan structure identified in said means for identifying scan structure.

18. An apparatus as described in claim 14 wherein said means for accessing further comprises means for receiving a specification command defining a scan segment, said scan segment including a member list of sequentially coupled scan cells and access points to said member list, said access points including a scan in and scan out.

19. An apparatus as described in claim 14 wherein said means for accessing further comprises means for receiving a specification command defining a scan path, said scan path including a list of scan structures to be linked together by said means for generating a scan plan and by said means for synthesizing said scan plan to form a scan chain of said scan structures.

20. An apparatus as described in claim 14 wherein said means for accessing further comprises means for receiving a specification command defining a scan configuration, said scan configuration including a number of said scan chains to be constructed by said means for generating a scan plan and by said means for synthesizing said scan plan and further including an indication of whether or not clock domain mixing is allowed by said means for generating a scan plan and by said means for synthesizing said scan plan in constructing said balanced scan chains.

* * * * *